(12) United States Patent
Chang

(10) Patent No.: US 12,489,074 B2
(45) Date of Patent: *Dec. 2, 2025

(54) PACKAGE STRUCTURE HAVING A DEVICE INSIDE A MOLDING MEMBER AND METHOD OF FORMING THE PACKAGE STRUCTURE

(71) Applicant: TAIWAN SEMICONDUCTOR MANUFACTURING COMPANY LTD., Hsinchu (TW)

(72) Inventor: Kuei-Sung Chang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/650,143

(22) Filed: Apr. 30, 2024

(65) Prior Publication Data

US 2024/0282739 A1     Aug. 22, 2024

Related U.S. Application Data

(63) Continuation of application No. 17/211,623, filed on Mar. 24, 2021, now Pat. No. 12,002,780.

(60) Provisional application No. 63/112,938, filed on Nov. 12, 2020.

(51) Int. Cl.
*H01L 23/00* (2006.01)
*H01L 23/18* (2006.01)
*H01L 25/065* (2023.01)

(52) U.S. Cl.
CPC .............. *H01L 24/16* (2013.01); *H01L 23/18* (2013.01); *H01L 24/14* (2013.01); *H01L 24/81* (2013.01);

(Continued)

(58) Field of Classification Search
CPC ......... H01L 23/04; H01L 23/10; H01L 23/14; H01L 23/18; H01L 24/13; H01L 24/16;

(Continued)

(56) References Cited

U.S. PATENT DOCUMENTS 6,294,408 B1    9/2001 Edwards et al.
10,707,177 B2 *  7/2020 Huang ................ H01L 23/3736
(Continued)

FOREIGN PATENT DOCUMENTS

CN      1259766 A    7/2000
CN    110767617 A    2/2020
(Continued)

OTHER PUBLICATIONS

Abstract translation of CN110767617A, (Feb. 7, 2020).
Abstract translation of CN210668340U, (Jun. 2, 2020).

*Primary Examiner* — Khiem D Nguyen
(74) *Attorney, Agent, or Firm* — WPAT LAW; Anthony King

(57) ABSTRACT

The present disclosure provides a package structure. The package structure includes a base, a device disposed on the base, a lid disposed over the base and the device and spaced apart from the device, and a first metal component disposed between the device and the lid, wherein the first metal component contacts the device and the lid. The present disclosure also provides a method for forming a package structure.

20 Claims, 32 Drawing Sheets

(52) U.S. Cl.
CPC .. *H01L 25/0657* (2013.01); *H01L 2224/1403* (2013.01); *H01L 2224/16245* (2013.01)

(58) Field of Classification Search
CPC ......... H01L 2224/1134; H01L 25/0657; H01L 25/50; H01L 2224/1403; H01L 2224/48901; H01L 2224/16195; H01L 2924/16195; H01L 2224/48091; H01L 2924/00014; H01L 24/14; H01L 24/81
See application file for complete search history.

(56) References Cited

U.S. PATENT DOCUMENTS

| | | | |
|---|---|---|---|
| 11,251,174 B2* | 2/2022 | Wu | H01L 31/0203 |
| 12,002,780 B2* | 6/2024 | Chang | H01L 24/16 |
| 2002/0042160 A1* | 4/2002 | Brooks | H01L 23/10 |
| | | | 257/E23.114 |
| 2015/0187679 A1* | 7/2015 | Ho | H01L 23/055 |
| | | | 438/118 |
| 2015/0187745 A1* | 7/2015 | Chiu | H01L 24/97 |
| | | | 257/737 |
| 2020/0135613 A1* | 4/2020 | Chen | H01L 23/3736 |

FOREIGN PATENT DOCUMENTS

| | | |
|---|---|---|
| CN | 111128928 A | 5/2020 |
| CN | 210668340 U | 6/2020 |

* cited by examiner

PACKAGE STRUCTURE HAVING A DEVICE INSIDE A MOLDING MEMBER AND METHOD OF FORMING THE PACKAGE STRUCTURE

CROSS REFERENCE TO RELATED APPLICATIONS

This application is related to Applicant's previously filed U.S. Application Ser. No. 63/112,938, filed Nov. 12, 2020, and is a continuous application of U.S. application Ser. No. 17/211,623 filed on Mar. 24, 2021, issued as U.S. Pat. No. 12,002,780, which is herein incorporated by reference.

BACKGROUND

Semiconductor devices are typically packaged using a molding material, and then may be installed on a base that includes electrical circuitry, such as a printed circuit board (PCB). After the semiconductor device is packaged, some parameters related to the semiconductor device inside the molding material are difficult to control. Conventional manufacturing methods fail to precisely control the parameters because these methods inevitably accumulate deviations or tolerances of the components in the package structure. The derived parameters are usually incorrect or insufficiently precise.

Therefore, there is a continuous need to modify the package structure and the manufacturing method for controlling parameters inside the package structure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
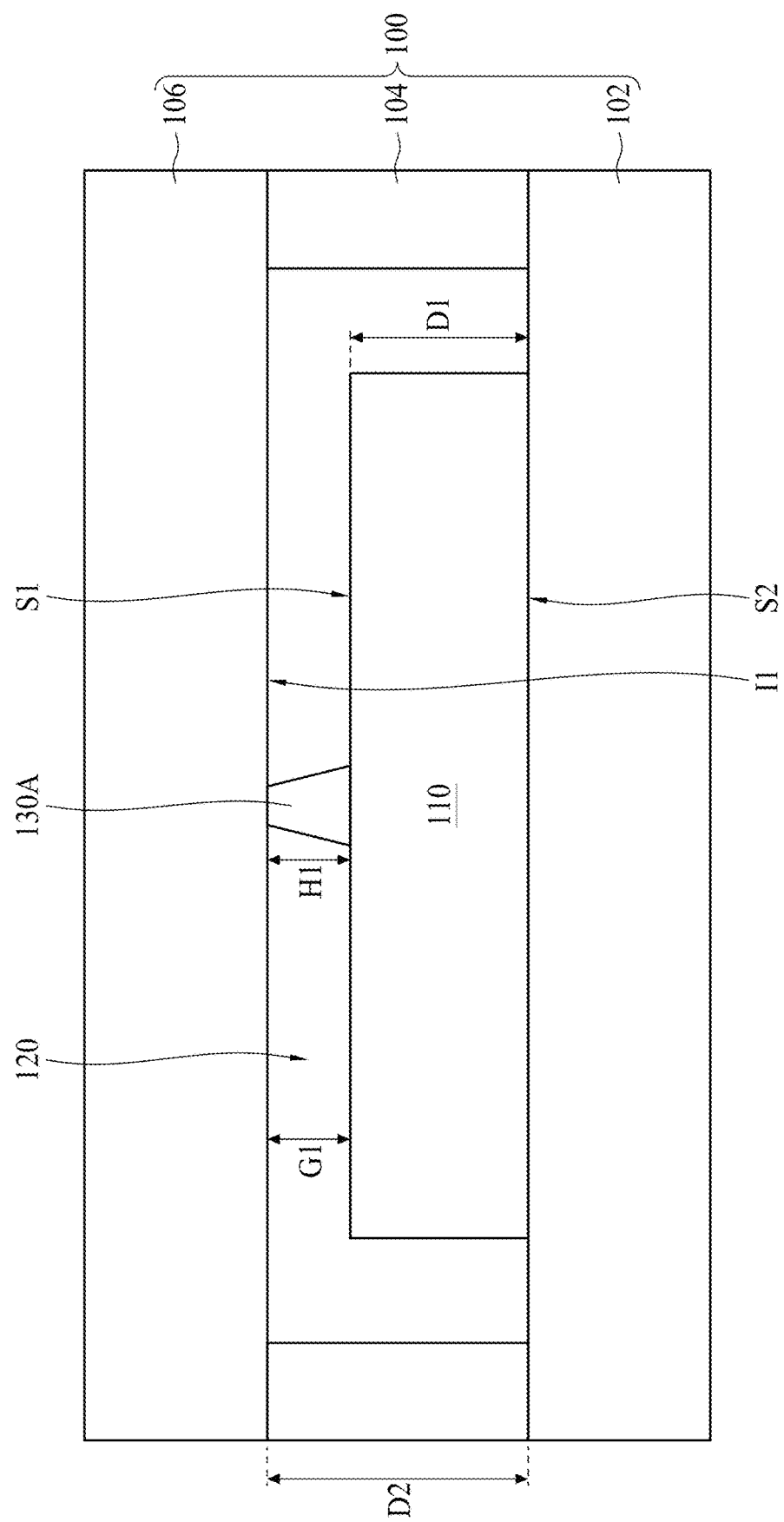
FIGS. 1 to 4 are schematic cross-sectional side views showing different package structures, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in some embodiments to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

For some devices that are encased by a molding material to form a package structure, there is a need to leave a space between the device and the molding material. For example, optical devices that include lens modules need a gap in order to accommodate a proper focal length from a lens to an image sensor such as a CMOS image sensor (CIS) or a charge-coupled device (CCD).

Controlling the gap size (e.g., gap width or gap volume) inside the package structure is important. For instance, in some applications, the gap size needs to be precisely controlled for considerations such as air flow resistance or heat dissipation of the device inside the package structure. In some embodiments, the gap size influences flexibility of the device when the device is subjected to an external impact or mechanical force. Therefore, the gap size is generally related to the durability of a device within a package structure, especially for an optical device. In particular, the gap size is critical to the performance of such optical devices.

However, it is difficult to measure the gap size once the device is packaged. Besides, it is not easy to precisely control the gap size. For package structures using epoxy resin or ceramics as the molding material, the gap size is controlled by dimensions (e.g., thickness or height) of the device and the molding material. Although the gap size can be directly determined by observing a difference between dimensions of the device and dimensions of a portion of the molding material, precision of the gap size is difficult to obtain.

FIG. 1 is a schematic cross-sectional side view showing a package structure P10, in accordance with some embodiments of the present disclosure. The package structure P10 includes a molding member 100 and a device 110 inside the molding member 100. In some embodiments, the molding member 100 is made of, but not limited to, epoxy resin or ceramics such as low-temperature co-fired (LTCC) ceramics or high-temperature co-fired (HTCC) ceramics.

In some embodiments, the device 110 includes active components or passive components, for example but not limited to, complementary metal-oxide semiconductors (CMOS), micro-electromechanical systems (MEMS), stacks of CMOS and MEMS, resistors, capacitors, inductors, image sensors, motion sensors, microphones, speakers, motion stabilizers and the like.

In some embodiments, the molding member 100 includes a base 102, a sidewall 104 and a lid 106. The device 110 is disposed on the base 102 and surrounded by the sidewall 104. In some embodiments, the device 110 has a top surface S1 facing the lid 106 and a bottom surface S2 facing the base 102. In some embodiments, the bottom surface S2 contacts the base 102. In some embodiments, multiple electrical conductors (not shown) are disposed on or within the base 102 to provide electrical connection to the device 110. In some embodiments, the lid 106 is disposed over the base 102 and away from the device 110 and the lid 106 is joined with the base 102 through the sidewall 104.

Still referring to FIG. 1, in some embodiments, the base 102, the sidewall 104 and the lid 106 are separable such that the molding member 100 can be divided into multiple parts. In such embodiments, a sealant (not shown) is disposed at junctions between the base 102 and the sidewall 104 and between the sidewall 104 and the lid 106. In other embodiments, the base 102, the sidewall 104 and the lid 106 are integral such that the molding member 100 is a monolithic structure that encases the device 110.

In some embodiments, the device 110 has a thickness D1. In some embodiments, the sidewall 104 has a height D2. In some embodiments, the height D2 is substantially greater than the thickness D1. In such embodiments, the lid 106 is spaced from the device 110 by a gap 120. In some embodiments, a distance between the top surface S1 of the device 110 and an interior surface I1 of the lid 106 facing the top surface S1 is defined as a gap width G1. In some embodiments, the gap width G1 is between about 5 micrometer (μm) and about 500 μm.

Still referring to FIG. 1, in some embodiments, a first metal component 130A is disposed between the device 110 and the lid 106. The first metal component 130A is disposed on the device 110 and contacts both the device 110 and the lid 106. In some embodiments, the first metal component 130A contacts the top surface S1 and the interior surface I1. In some embodiments, the first metal component 130A can be separated from the device 110 and the lid 106. In some embodiments, the first metal component 130A can have any suitable configuration. For example, the first metal component 130A can be a wire, a stud, a rod, a bump, a stack of studs or a stack of bumps. In some embodiments, when the first metal component 130A is attached to the device 110, a width of the first metal component 130A is decreased towards the lid 106. In some embodiments, the first metal component 130A is tapered from the device 110 towards the lid 106. In some embodiments, the first metal component 130A has a first height H1, wherein the gap width G1 is substantially equals to the first height H1, i.e., G1=H1.

Figure 2:
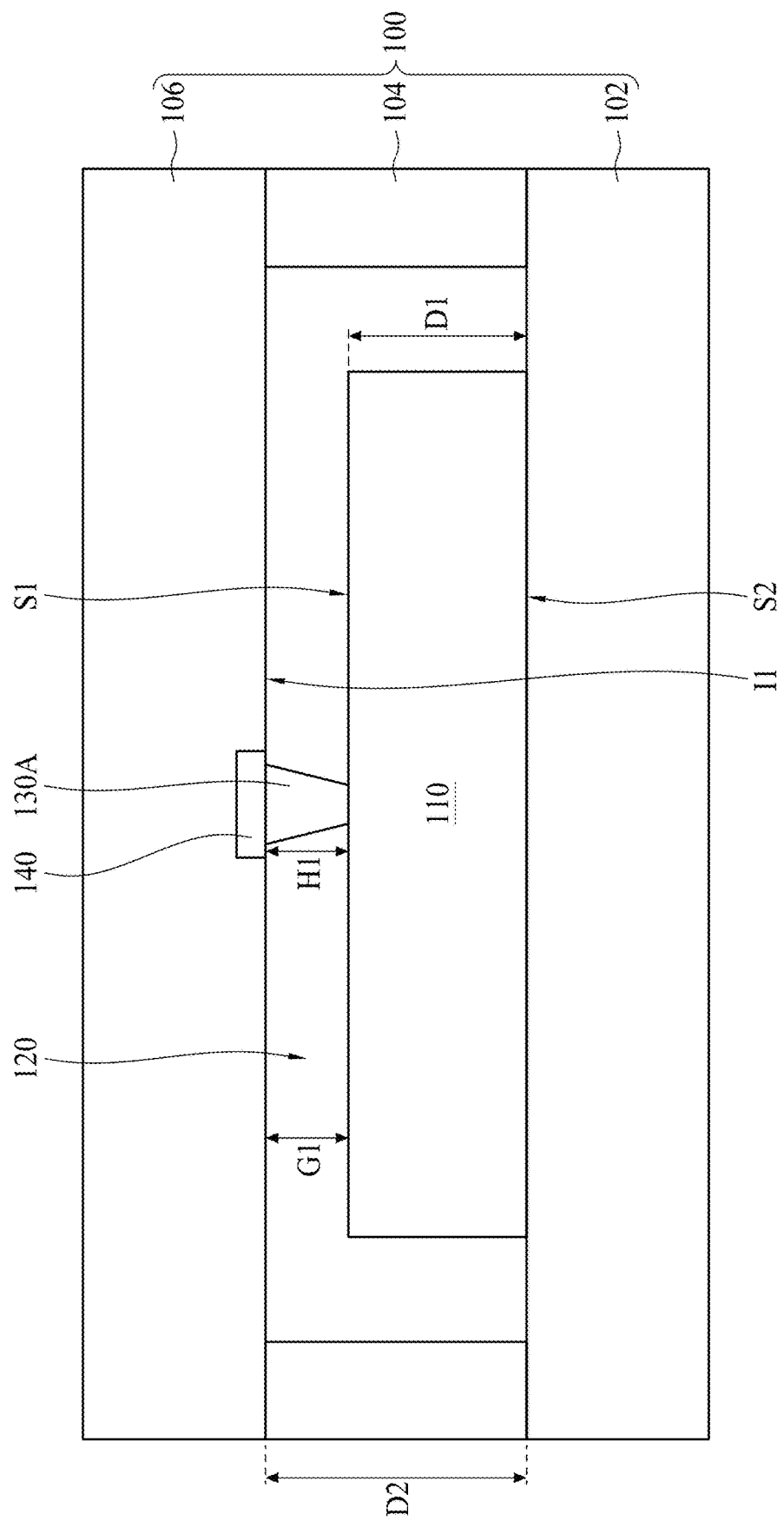

FIG. 2 is a schematic cross-sectional side view showing a package structure P11, in accordance with some embodiments of the present disclosure. The package structure P11 is similar to the package structure P10 in FIG. 1, except the package structure P11 further includes a first interconnect structure 140 embedded in the lid 106. The first interconnect structure 140 can be, for example, a lead frame. In some embodiments, a surface of the first interconnect structure 140 is coplanar with the interior surface I1 of the lid 106. In some embodiments, the first metal component 130A is disposed on the first interconnect structure 140 within the lid 106. In such embodiments, the first metal component 130A is pressed against the device 110 and contacts both the first interconnect structure 140 and the device 110. In some embodiments, when the first metal component 130A is attached to the lid 106, the width of the first metal component 130A is decreased towards the device 110. In some embodiments, the first metal component 130A is tapered from the first interconnect structure 140 towards the device 110.

Figure 3:
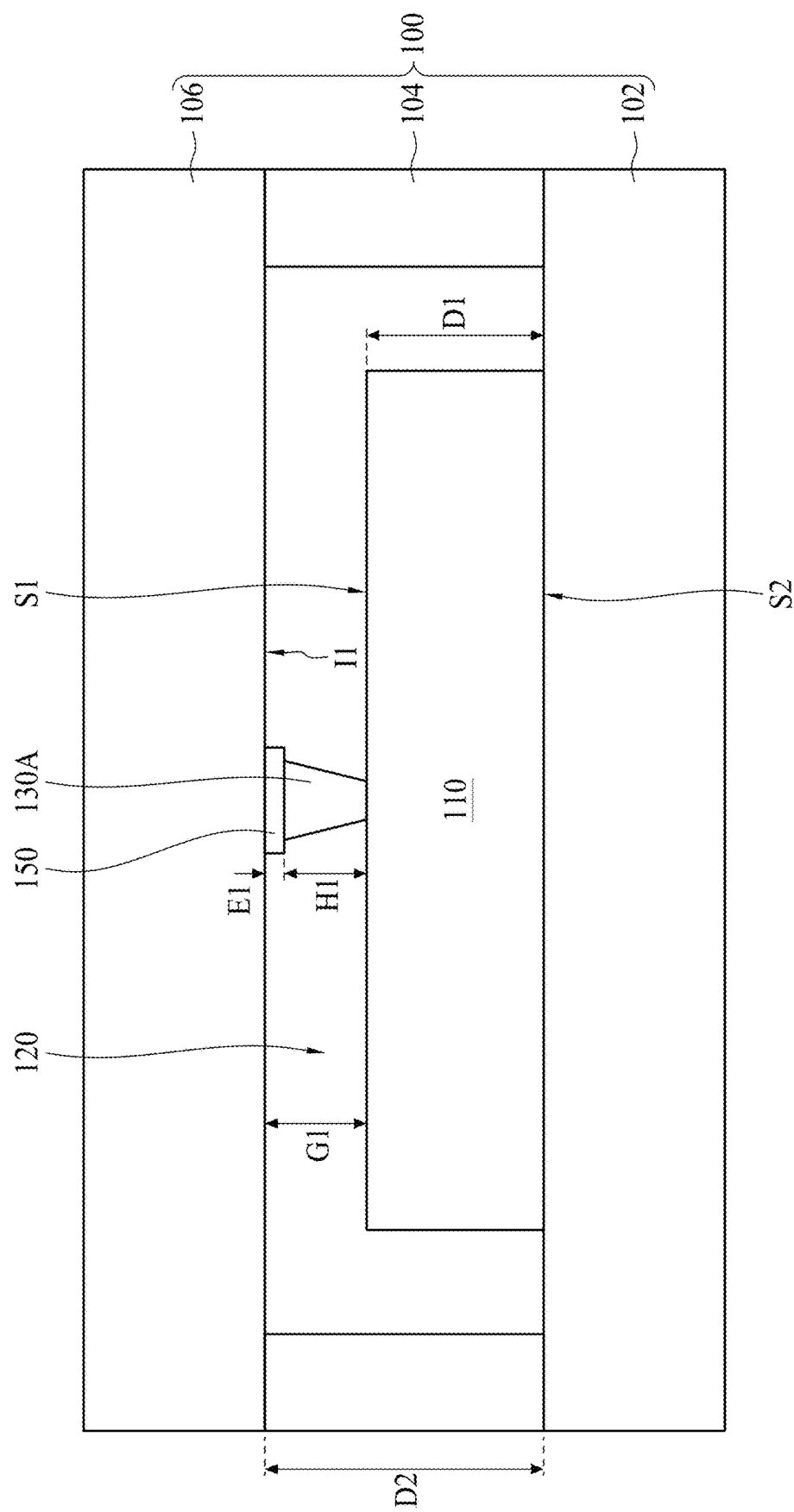

FIG. 3 is a schematic cross-sectional side view showing a package structure P12, in accordance with some embodiments of the present disclosure. The package structure P12 is similar to the package structure P10 in FIG. 1, except the package structure P12 further includes a second interconnect structure 150 mounted on the interior surface I1 of the lid 106. In some embodiments, the second interconnect structure 150 is protruded from the interior surface I1 of the lid 106. The second interconnect structure 150 can be, for example, a pin or an electrode. In some embodiments, the first metal component 130A is disposed on the second interconnect structure 150 on the lid 106. In such embodiments, the first metal component 130A is pressed against the device 110 and contacts both the second interconnect structure 150 and the device 110. In some embodiments, the second interconnect structure 150 has a thickness E1, and the gap width G1 is substantially equals to the total of the first height H1 and the thickness E1, i.e., G1=H1+E1.

Figure 4:
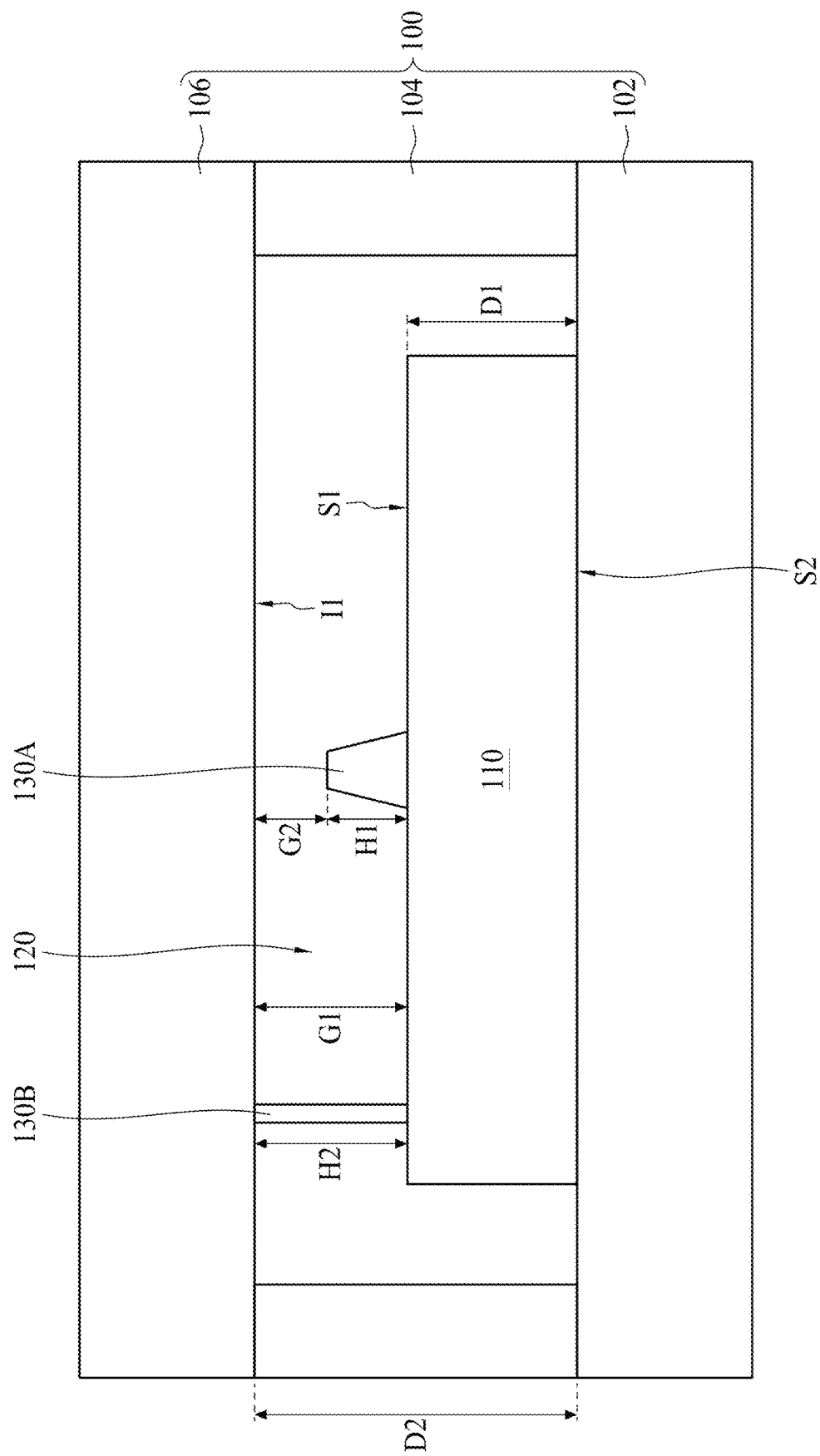

FIG. 4 is a schematic cross-sectional side view showing a package structure P13, in accordance with some embodiments of the present disclosure. The package structure P13 is similar to the package structure P10 in FIG. 1, except the package structure P13 further includes a second metal component 130B. In some embodiments, a second height H2 of the second metal component 130B is different from the first height H1 of the first metal component 130A. For example, the second height H2 is substantially greater than the first height H1. In such embodiments, the first metal component 130A disposed on the device 110 does not contact the lid 106. In some embodiments, the second metal component 130B is in different configuration from the first metal component 130A. For example, the first metal component 130A is a stud while the second metal component 130B is a wire, as shown in FIG. 4. In other embodiments, the second metal component 130B is in the same configuration as the first metal component 130A. For example, the first metal component 130A is a stud and the second metal component 130B is a stack of studs. In some embodiments, the second metal component 130B stands upright on the device 110.

In some embodiments, the second metal component 130B is disposed between the device 110 and the lid 106. The second metal component 130B is disposed on the device 110 and contacts both the device 110 and the lid 106. In some embodiments, the second metal component 130B contacts the top surface S1 and the interior surface I1. In some embodiments, the second metal component 130B can be separated from the device 110 and the lid 106. In some embodiments, the gap width G1 is substantially equals to the second height H2, i.e., G1=H2. In some embodiments, a distance between a top surface of the first metal component 130A and the interior surface I1 of the lid 106 facing the device 110 is defined as a gap width G2. In some embodiments, the second height H2 is equal to a total of the gap width G2 and the first height H1. In such embodiments, the gap width G2 is substantially equals to a difference between the second height H2 and the first height H1, i.e., G2=H2−H1.

Figure 5:
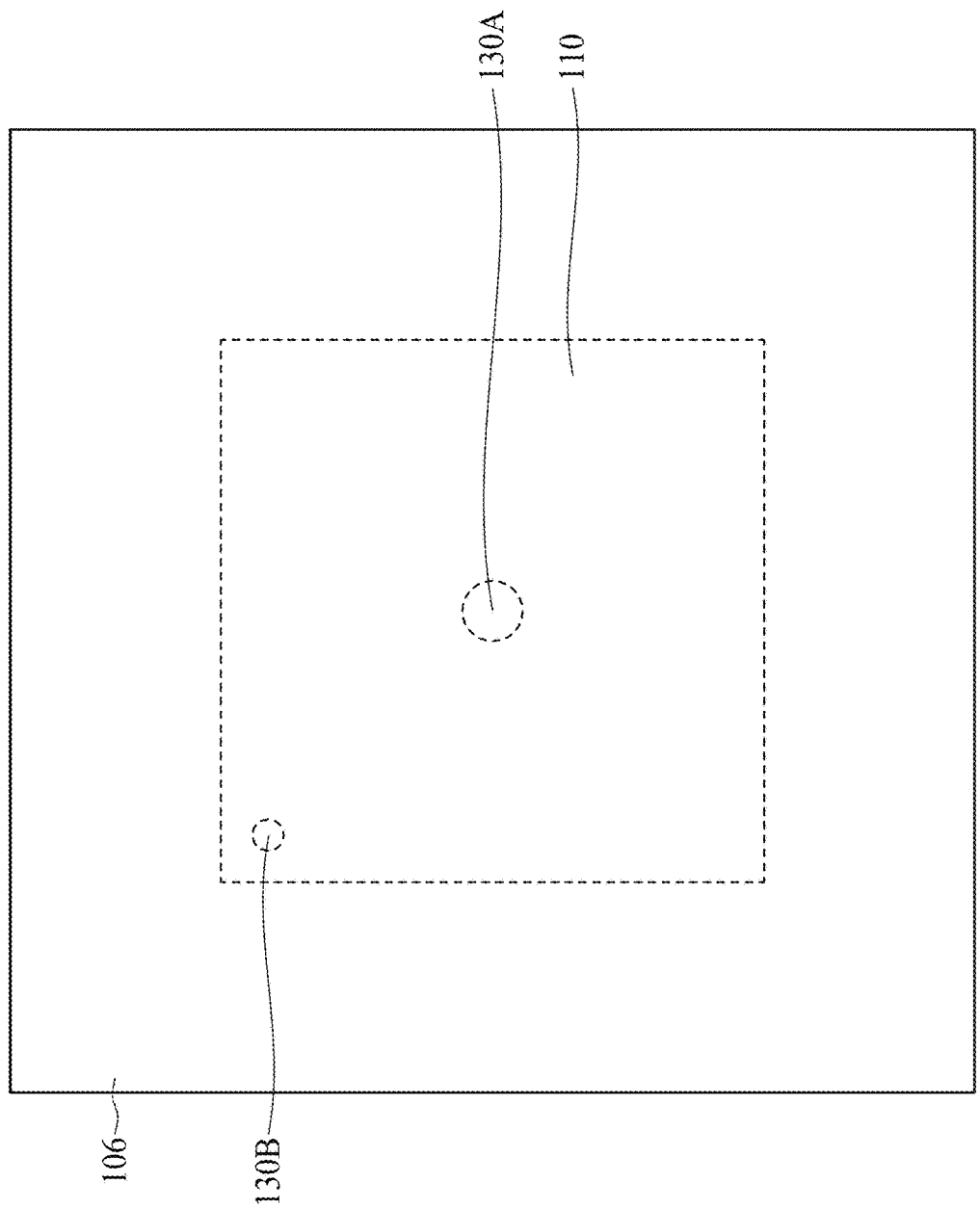
FIG. 5 is a top view of the package structure in FIG. 4, in accordance with some embodiments of the present disclosure.

FIG. 5 is a top perspective view of the package structure P13 in FIG. 4, in accordance with some embodiments of the present disclosure. The first and the second metal components 130A, 130B are disposed between the device 110 and the lid 106 but are obscured below the lid 106 in the top view. In some embodiments, the first and the second metal components 130A, 130B can be located on any portion of the device 110. In some embodiments, the first metal component 130A is disposed on a central portion of the device 110 and the second metal component 130B is disposed on a peripheral portion of the device 110. In some embodiments, cross sections of the first and the second metal components 130A, 130B respectively can be various shapes such as circle, triangle, rectangle, square or the like.

Figure 6:
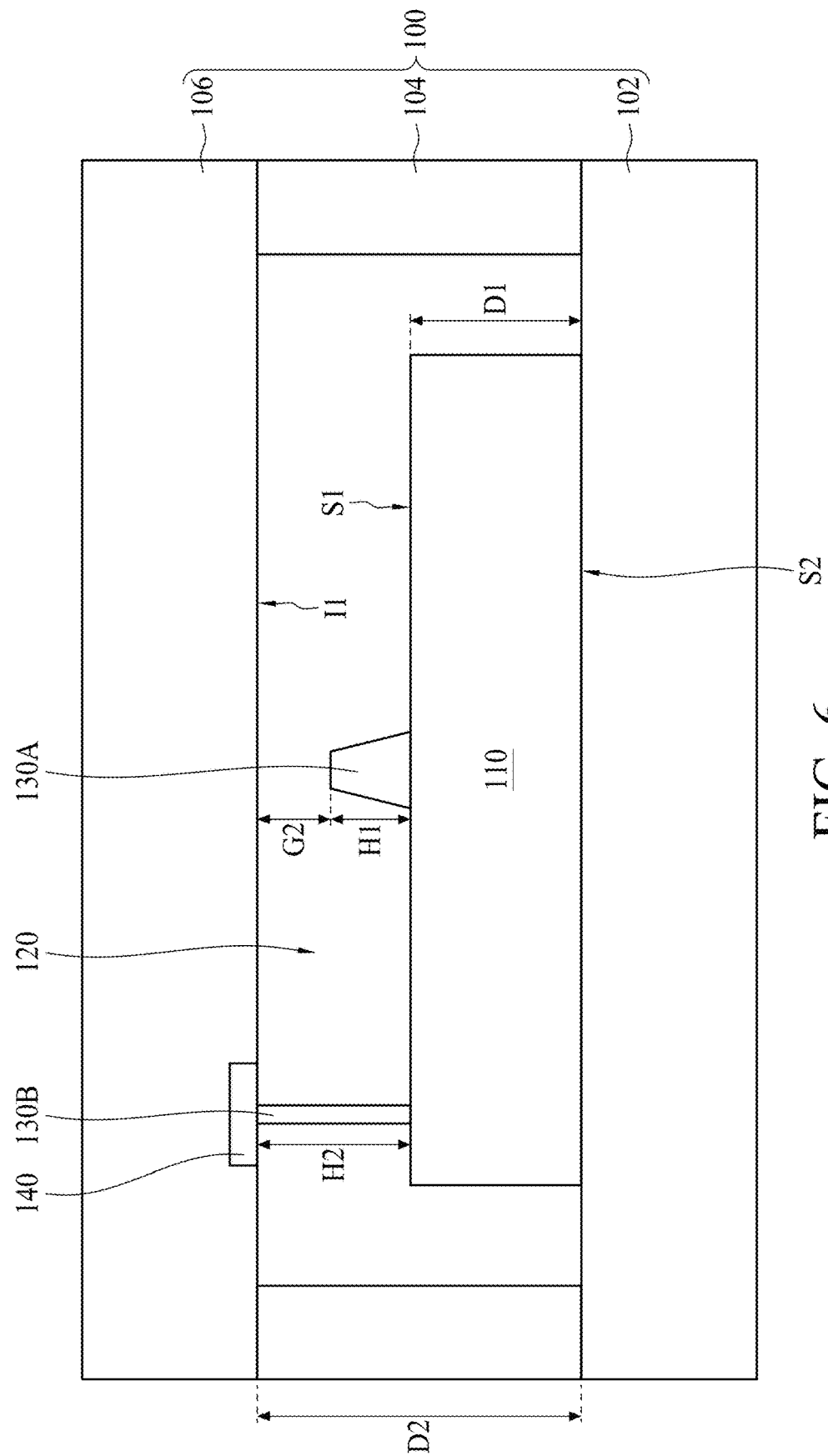
FIGS. 6 to 17 are schematic cross-sectional side views showing different package structures, in accordance with various embodiments of the present disclosure.

FIG. 6 is a schematic cross-sectional side view showing a package structure P14, in accordance with some embodiments of the present disclosure. The package structure P14 is similar to the package structure P13 in FIG. 4, except the package structure P14 further includes the first interconnect structure 140. In some embodiments, the second metal component 130B is disposed on the first interconnect structure 140 within the lid 106, while the first metal component 130A is disposed on the device 110. In such embodiments, the second metal component 130B is pressed against the device 110 and contacts both the first interconnect structure 140 and the device 110.

Figure 7:
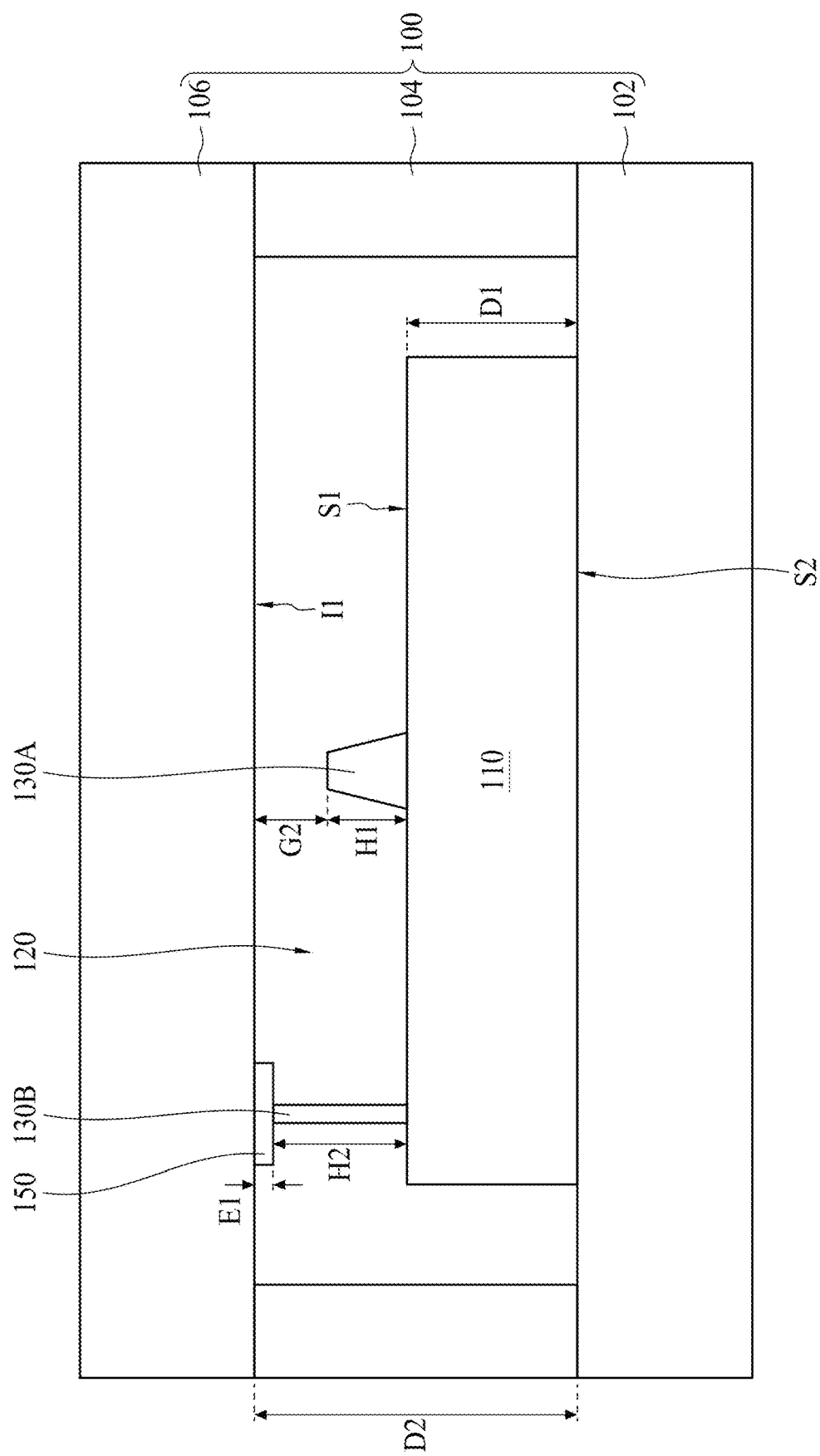

FIG. 7 is a schematic cross-sectional side view showing a package structure P15, in accordance with some embodiments of the present disclosure. The package structure P15 is similar to the package structure P13 in FIG. 4, except the package structure P15 further includes the second interconnect structure 150. In some embodiments, the second metal component 130B is disposed on the second interconnect structure 150 on the lid 106, while the first metal component 130A is disposed on the device 110. In such embodiments, the second metal component 130B is pressed against the device 110 and contacts both the second interconnect structure 150 and the device 110. In some embodiments, a total of the thickness E1 and the second height H2 is equal to a total of the gap width G2 and the first height H1. In such embodiments, the gap width G2 is substantially equals to the total of the thickness E1 and the second height H2 subtracting the first height H1, i.e., G2=E1+H2−H1.

Figure 8:
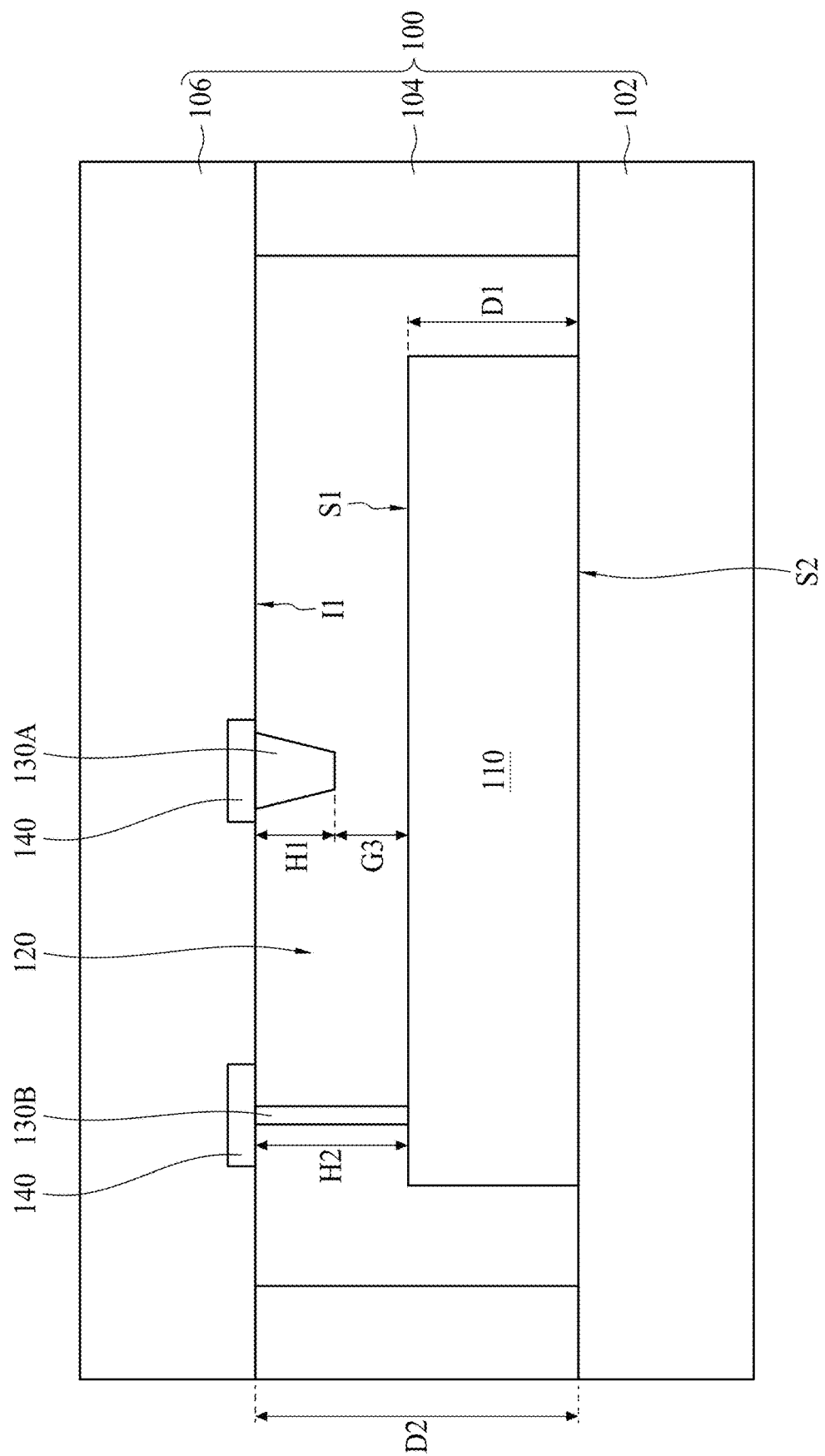

FIG. 8 is a schematic cross-sectional side view showing a package structure P16, in accordance with some embodiments of the present disclosure. The package structure P16 is similar to the package structure P14 in FIG. 6, except the package structure P16 includes multiple first interconnect structures 140 embedded in the lid 106. In some embodiments, the first metal component 130A and the second metal component 130B are respectively disposed on one of the first interconnect structures 140 within the lid 106. In such embodiments, the first metal component 130A attached to the lid 106 does not contact the device 110. In some embodiments, a distance between a top surface of the first metal component 130A and the top surface S1 of the device 110 is defined as a gap width G3. In some embodiments, the second height H2 is equal to a total of the gap width G3 and the first height H1. In such embodiments, the gap width G3 is substantially equals to a difference between the second height H2 and the first height H1, i.e., G3=H2−H1.

Figure 9:
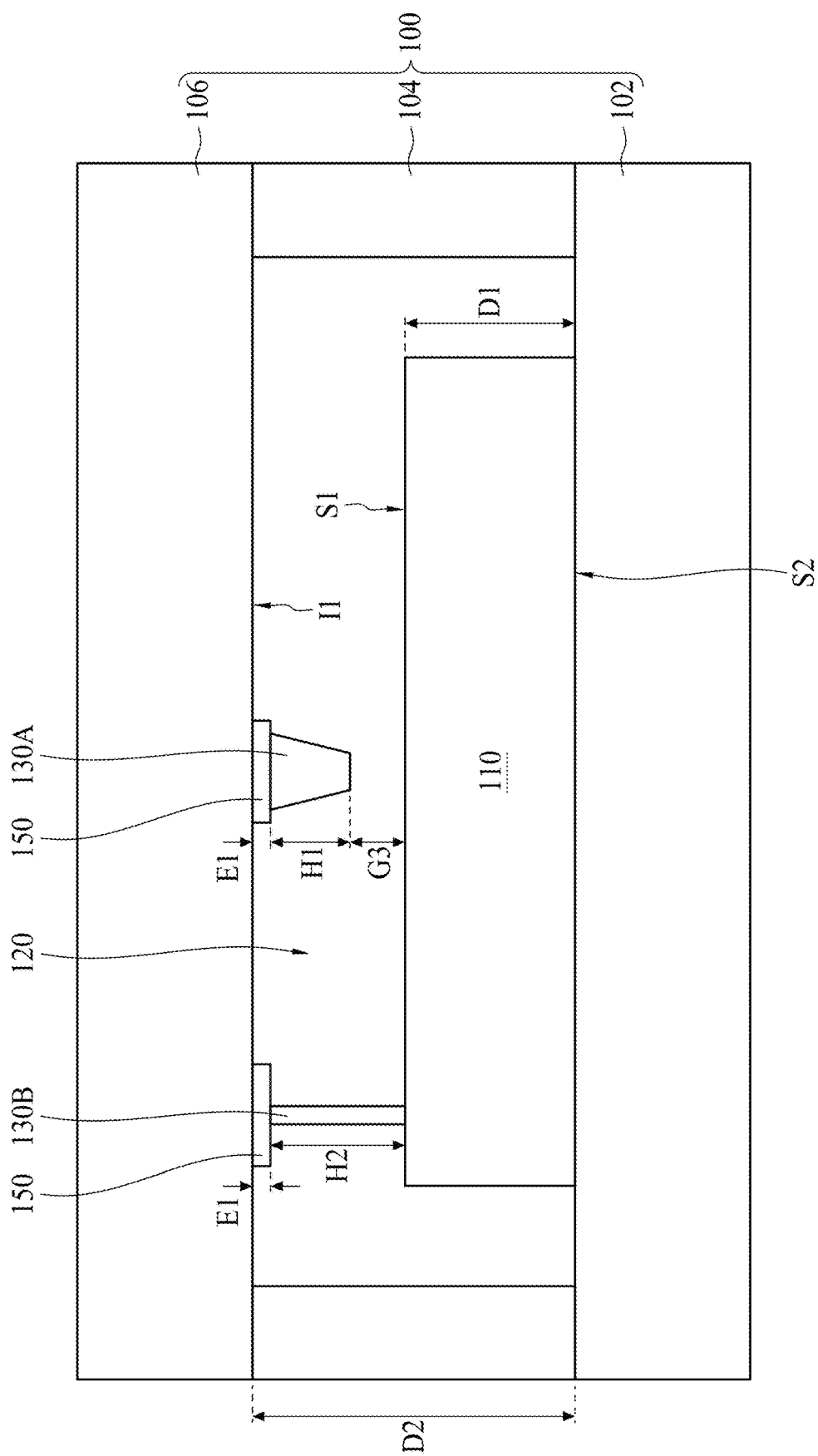

FIG. 9 is a schematic cross-sectional side view showing a package structure P17, in accordance with some embodiments of the present disclosure. The package structure P17 is similar to the package structure P15 in FIG. 7, except the package structure P17 includes multiple second interconnect structures 150 mounted on the interior surface I1 of the lid 106. In some embodiments, the first metal component 130A and the second metal component 130B are respectively disposed on one of the second interconnect structures 150 on the lid 106. In such embodiments, the first metal component 130A attached to the lid 106 does not contact the device 110. In some embodiments, the gap width G3 is substantially equals to a difference between the second height H2 and the first height H1, i.e., G3=H2−H1.

Figure 10:
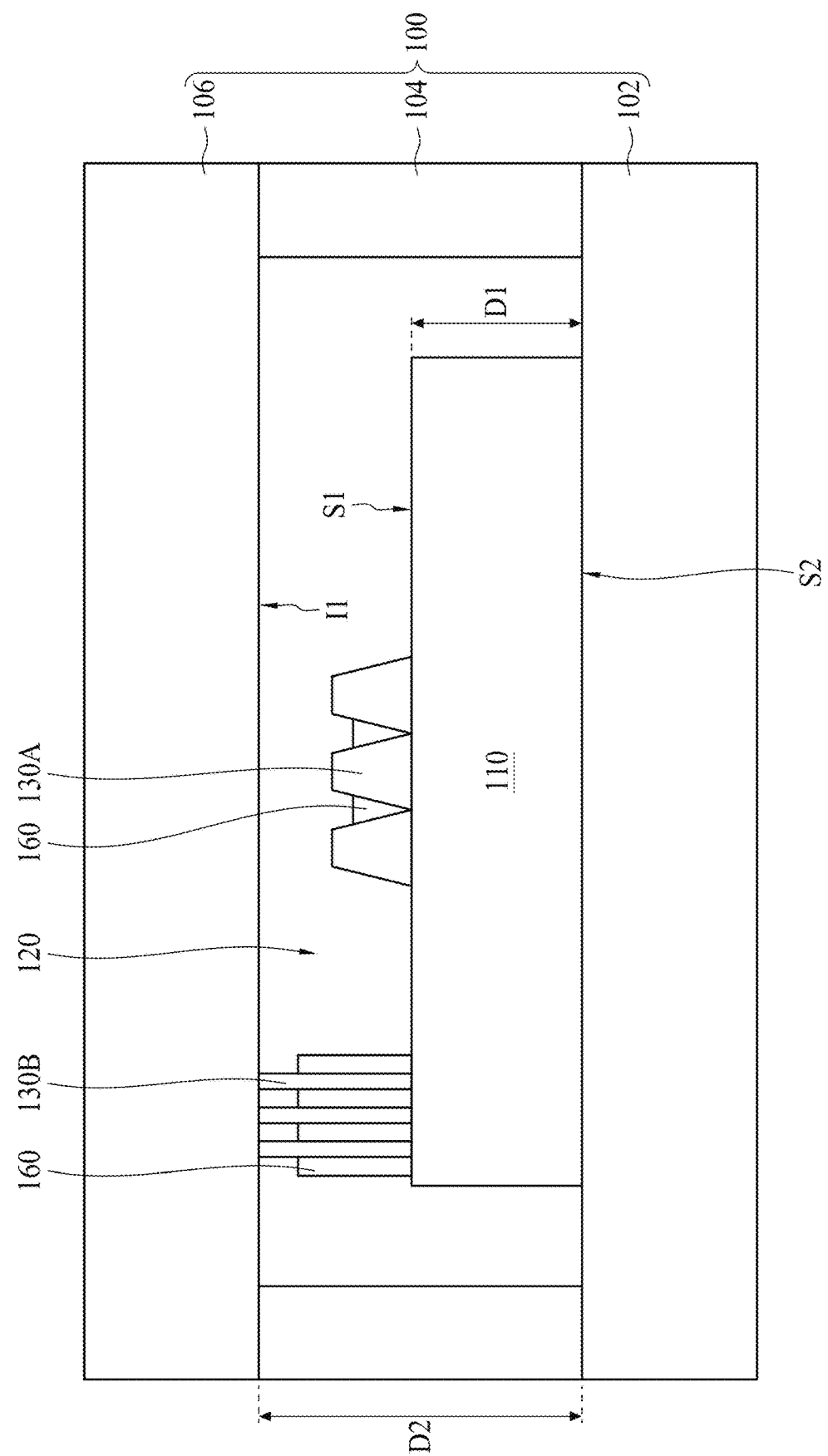

FIG. 10 is a schematic cross-sectional side view showing a package structure P18, in accordance with some embodiments of the present disclosure. The package structure P18 is similar to the package structure P13 in FIG. 4, except the package structure P18 includes adjacent first metal components 130A disposed on the device 110 and adjacent second metal components 130B disposed between the device 110 and the lid 106. In some embodiments, all the second metal components 130B contact both the device 110 and the lid 106.

The arrangement of the first metal components 130A and the second metal components 130B are not limited. In some embodiments, all the first metal components 130A are disposed on a central region of the device 110 and all the second metal components 130B are disposed on a peripheral region of the device 110, as shown in FIG. 10. In other embodiments, the first metal components 130A and the second metal components 130B are alternatively arranged with each other. In some embodiments, a filling material 160 is disposed between proximal first metal components 130A and between proximal second metal components 130B. In some embodiments, the filling material 160 can be disposed to surround the first metal component 130A or the second metal component 130B in any of the package structures P10 to P18. In some embodiments, the filling material 160 is made of, but not limited to, polymers such as epoxy resin or inorganic compounds such as silica or the combination of polymer and inorganic compounds. In some embodiments, the filling material 160 can strengthen the attachment of the first metal components 130A and the second metal components 130B to the device 110.

Figure 11:
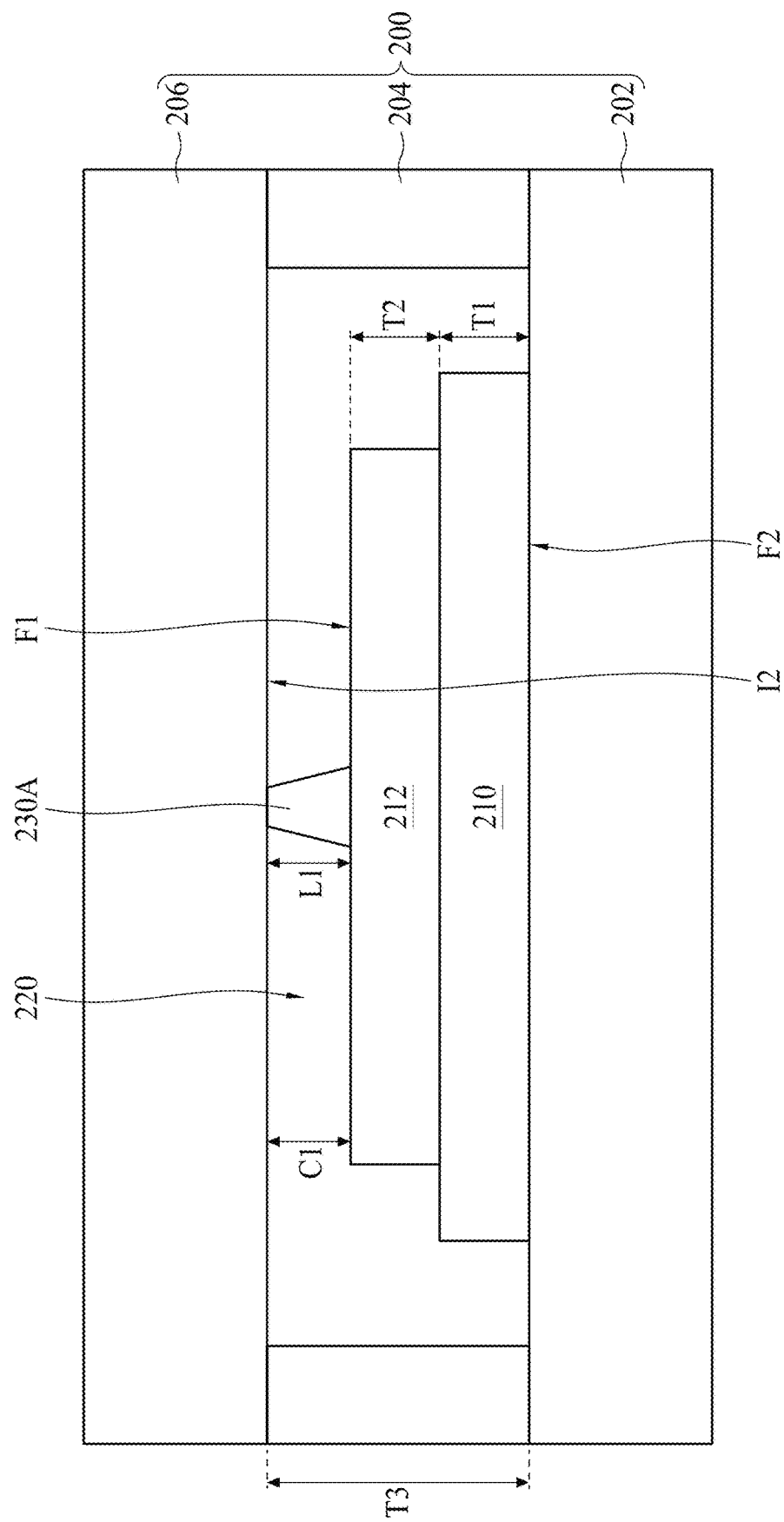

FIG. 11 is a schematic cross-sectional side view showing a package structure P20, in accordance with some embodiments of the present disclosure. The package structure P20 includes a molding member 200, a first device 210 and a second device 212, wherein the first device 210 and the second device 212 are inside the molding member 200. In some embodiments, the molding member 200 is of the same material as the molding member 100. In some embodiments, the first device 210 and the second device 212 include similar electrical components as the device 110. In some embodiments, the molding member 200 includes a base 202, a sidewall 204 and a lid 206. The first device 210 is disposed on the base 202 and the second device 212 is disposed on the first device 210.

In some embodiments, the second device 212 has a top surface F1 facing the lid 206 and the first device 210 has a bottom surface F2 facing the base 202. In some embodiments, the bottom surface F2 contacts the base 202. In some embodiments, multiple electrical conductors (not shown) are disposed on or within the base 202 to provide electrical connection to the first device 210 and the second device 212. In some embodiments, the lid 206 is disposed over the base 202 and away from the first device 210 and the second device 212. The lid 206 is joined with the base 202 through the sidewall 204, wherein both the first device 210 and the second device 212 are surrounded by the sidewall 204.

Still referring to FIG. 11, in some embodiments, the base 202, the sidewall 204 and the lid 206 are separable such that the molding member 200 can be divided into multiple parts. In such embodiments, a sealant (not shown) is disposed at junctions between the base 202 and the sidewall 204 and between the sidewall 204 and the lid 206. In other embodiments, the base 202, the sidewall 204 and the lid 206 are integral such that the molding member 200 is a monolithic structure that encases the first device 210 and the second device 212.

In some embodiments, the first device 110 has a first thickness T1, the second device 212 has a second thickness T2, and the sidewall 204 has a height T3, wherein the height T3 is substantially greater than a total of the first thickness T1 and the second thickness T2. In such embodiments, the lid 206 is spaced from the second device 212 by a gap 220. In some embodiments, a distance between the top surface F1 of the second device 212 and an interior surface I2 of the lid 206 facing the top surface F1 is defined as a gap width C1. In some embodiments, the gap width C1 is between about 5 µm and about 500 µm.

Still referring to FIG. 11, in some embodiments, a first metal component 230A is disposed between the second device 212 and the lid 206. The first metal component 230A is disposed on the second device 212 and contacts both the second device 212 and the lid 206. In some embodiments, the first metal component 230A can be separated from the second device 212 and the lid 206. In some embodiments, the first metal component 230A can have any convenient configuration. For example, the first metal component 230A can be a wire, a stud, a rod, a bump, a stack of studs or a stack of bumps. In some embodiments, when the first metal component 230A is attached to the second device 212, a width of the first metal component 230A is decreased towards the lid 206. In some embodiments, the first metal component 230A has a first height L1, wherein the gap width C1 is substantially equals to the first height L1, i.e., C1=L1.

Figure 12:
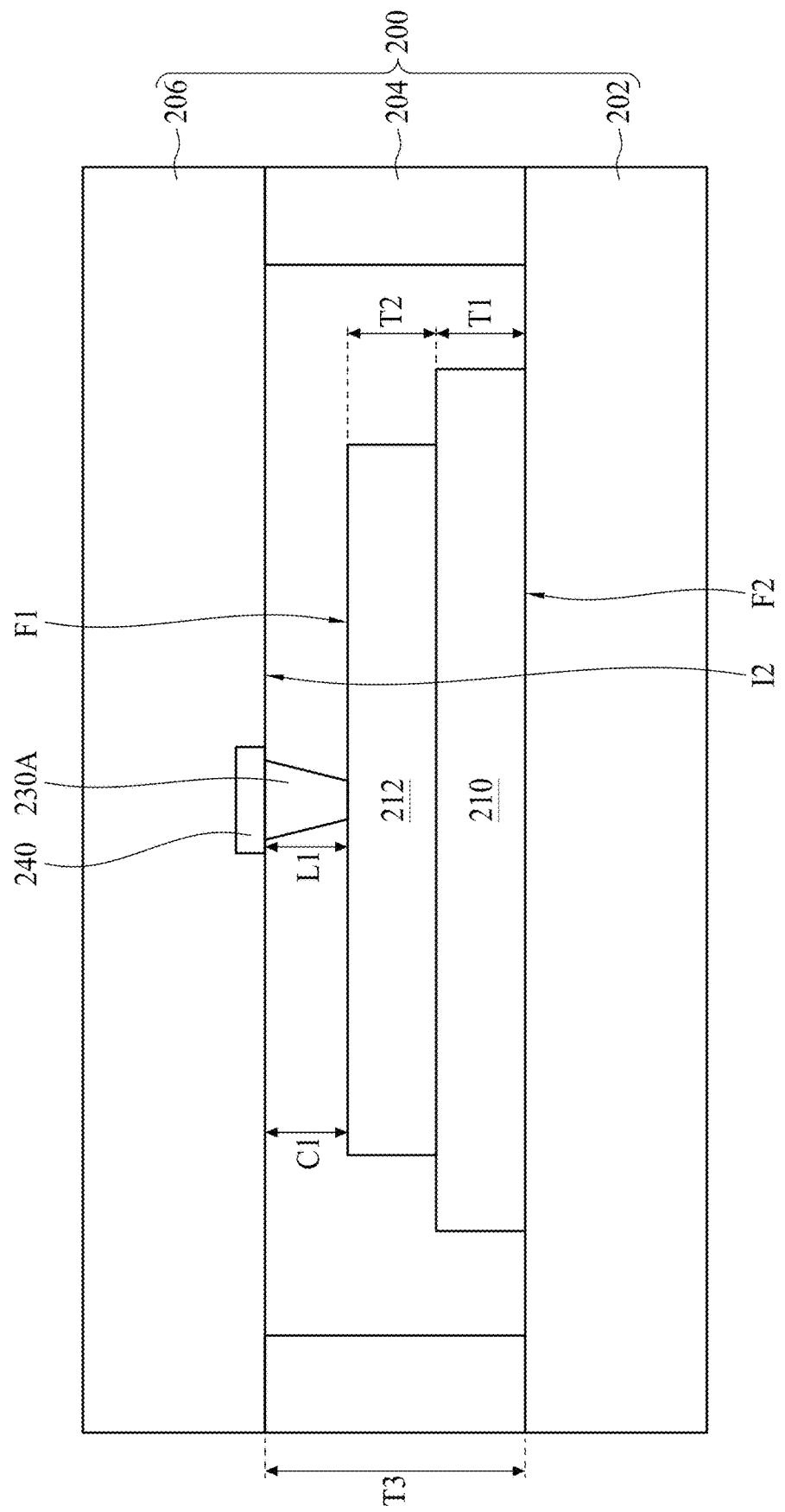

FIG. 12 is a schematic cross-sectional side view showing a package structure P21, in accordance with some embodiments of the present disclosure. The package structure P21 is similar to the package structure P20 in FIG. 11, except the package structure P21 further includes a first interconnect structure 240 embedded in the lid 206. The first interconnect structure 240 can be, for example, a lead frame. In some embodiments, a surface of the first interconnect structure 240 is coplanar with the interior surface I2 of the lid 206. In some embodiments, the first metal component 230A is disposed on the first interconnect structure 240 within the lid 206. In such embodiments, the first metal component 230A is pressed against the second device 212 and contacts both the first interconnect structure 240 and the second device 212. In some embodiments, when the first metal component 230A is attached to the lid 206, the width of the first metal component 230A is decreased towards the second device 212.

Figure 13:
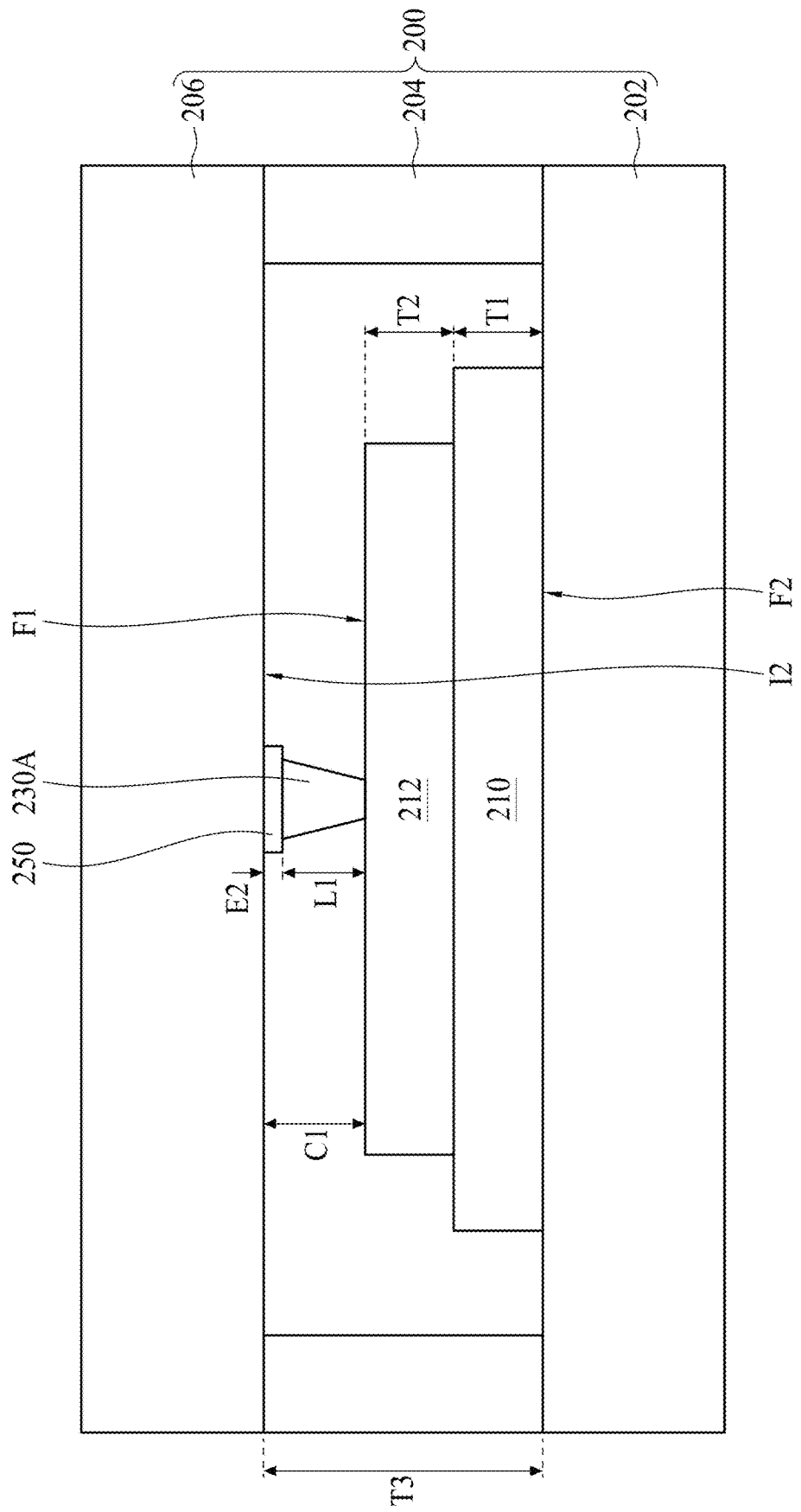

FIG. 13 is a schematic cross-sectional side view showing a package structure P22, in accordance with some embodiments of the present disclosure. The package structure P13 is similar to the package structure P20 in FIG. 11, except the package structure P22 further includes a second interconnect structure 250 mounted on the interior surface I2 of the lid 206. The second interconnect structure 250 can be, for example, a pin or an electrode. In some embodiments, the first metal component 230A is disposed on the second interconnect structure 250 on the lid 206. In such embodiments, the first metal component 230A is pressed against the second device 212 and contacts both the second interconnect structure 250 and the second device 212. In some embodiments, the second interconnect structure 250 has a controlled thickness E2 and the gap width C1 is substantially equals to the total of the first height L1 and the thickness E2, i.e., C1=L1+E2.

Figure 14:
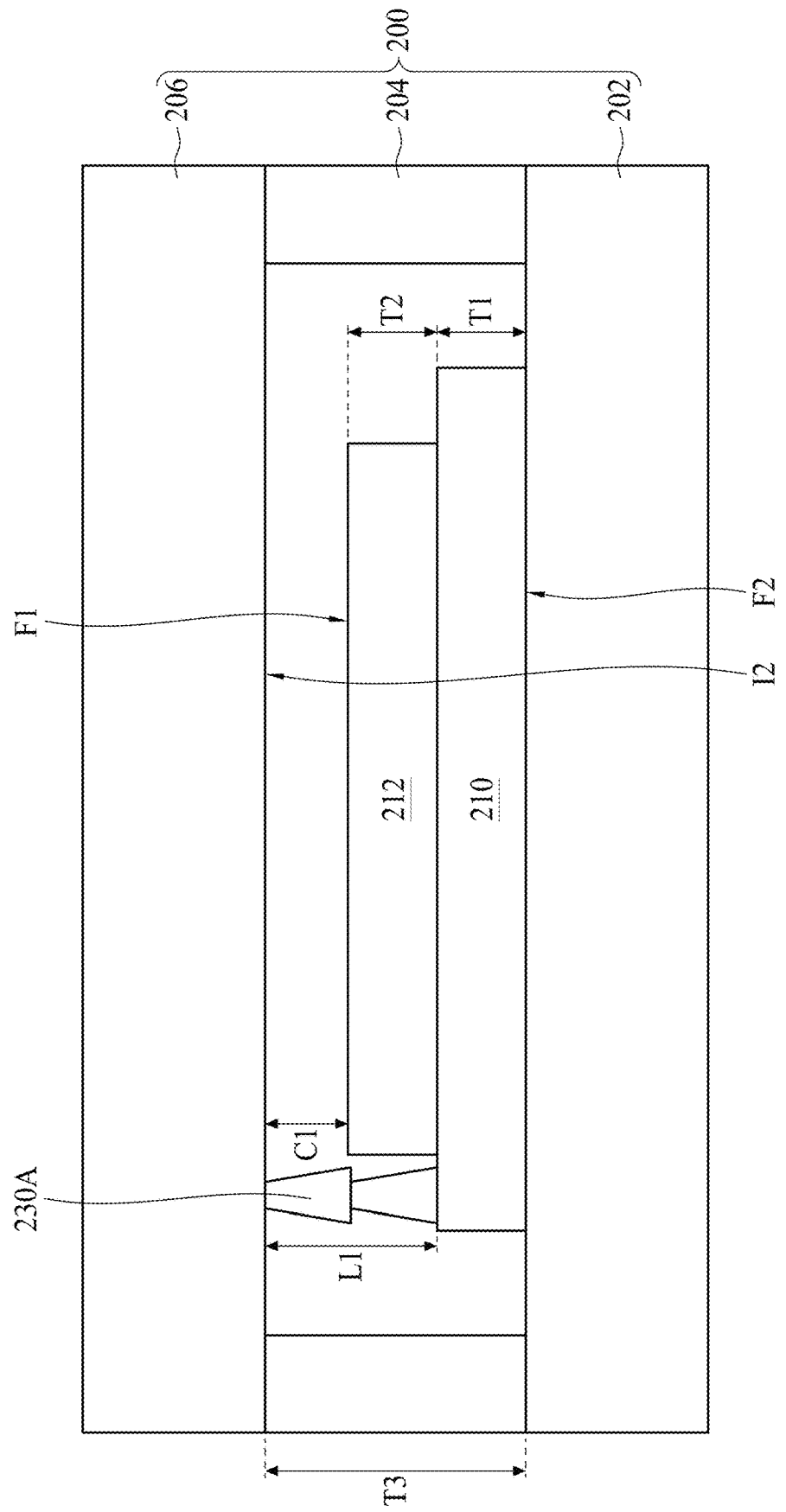
Figure 15:
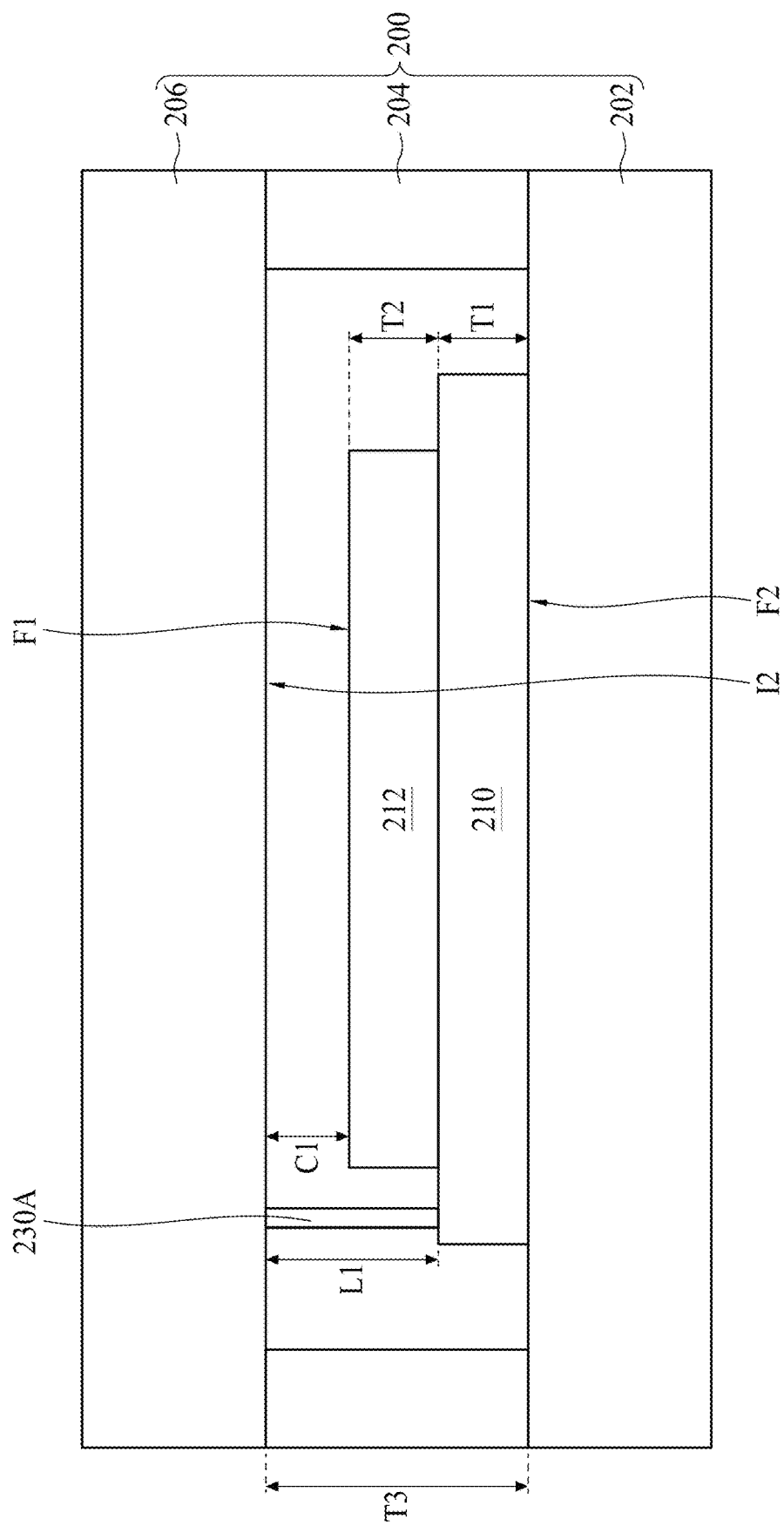

FIGS. 14 and 15 are schematic cross-sectional side views showing package structures P23 and P24, in accordance with some embodiments of the present disclosure. The package structures P23, P24 are similar to the package structure P20 in FIG. 11, except the first metal component 230A is disposed on the first device 210. In some embodiments, the first metal component 230A contacts both the first device 210 and the lid 206. In such embodiments, the first metal component 230A is a stack of studs, as shown in FIG. 14. In some embodiments, the first metal component 230A is a wire as shown in FIG. 15. In some embodiments, the first metal component 230A can be separated from the first device 210 and the lid 206. In some embodiments, the first height L1 is equal to a total of the gap width C1 and the second thickness T2. In such embodiments, the gap width C1 is substantially equals to a difference between the first height L1 and the second thickness T2, i.e., C1=L1−T2.

Figure 16:
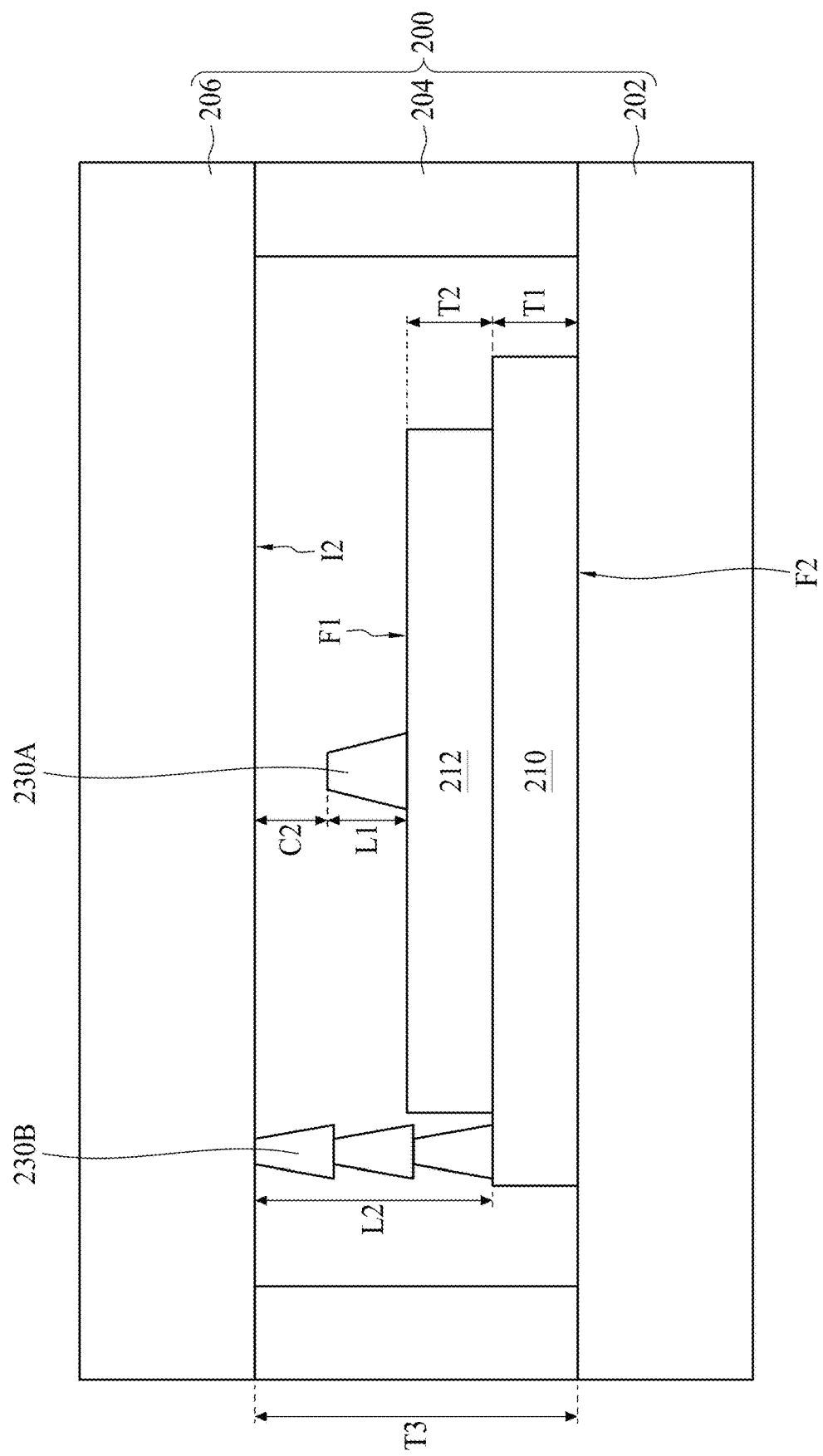
Figure 17:
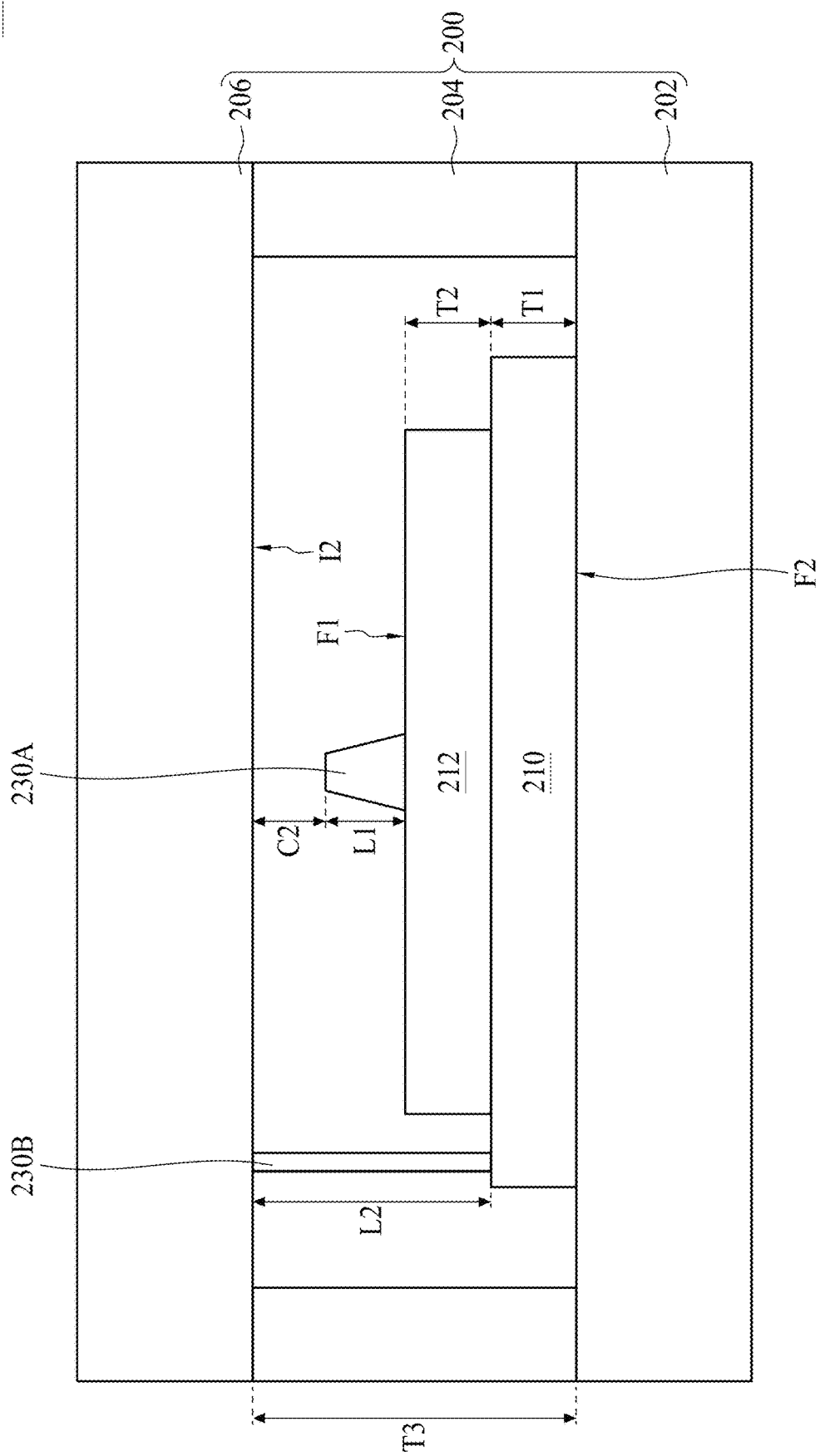

FIGS. 16 and 17 are schematic cross-sectional side views showing package structures P25 and P26, in accordance with some embodiments of the present disclosure. The package structures P25, P26 are similar to the package structure P20 in FIG. 11, except either the package structure P25 or the package structure P26 further includes a second metal component 230B. In some embodiments, the second metal component 230B is in the same configuration as the first metal component 230A. As shown in FIG. 16, the first metal component 230A is a stud and the second metal component 230B is a stack of studs. In other embodiments, the second metal component 230B is in different configuration from the first metal component 230A. As shown in FIG. 17, the first metal component 230A is a stud while the second metal component 230B is a wire. In some embodiments, the second metal component 230B is disposed between the first device 210 and the lid 206. The second metal component 230B is disposed on the first device 210 and contacts both the first device 210 and the lid 206. In some embodiments, the second metal component 230B can be separated from the first device 210 and the lid 206. In some embodiments, a second height L2 of the second metal component 230B is different from the first height L1 of the first metal component 230A. For example, the second height L2 is substantially greater than the first height L1, as shown in FIG. 16. In such embodiments, the first metal component 230A disposed on the second device 212 does not contact the lid 206. In some embodiments, a distance between a top surface of the first metal component 230A and the interior surface I2 of the lid 206 facing the second device 212 is defined as a gap width C2. In some embodiments, the second height L2 is equal to a total of the gap width C2, the first height L1 and the second thickness T2. In such embodiments, the gap width C2 is substantially equals to the second height L2 subtracting the first height L1 and the second thickness T2, i.e., C2=L2−L1−T2.

Figure 18:
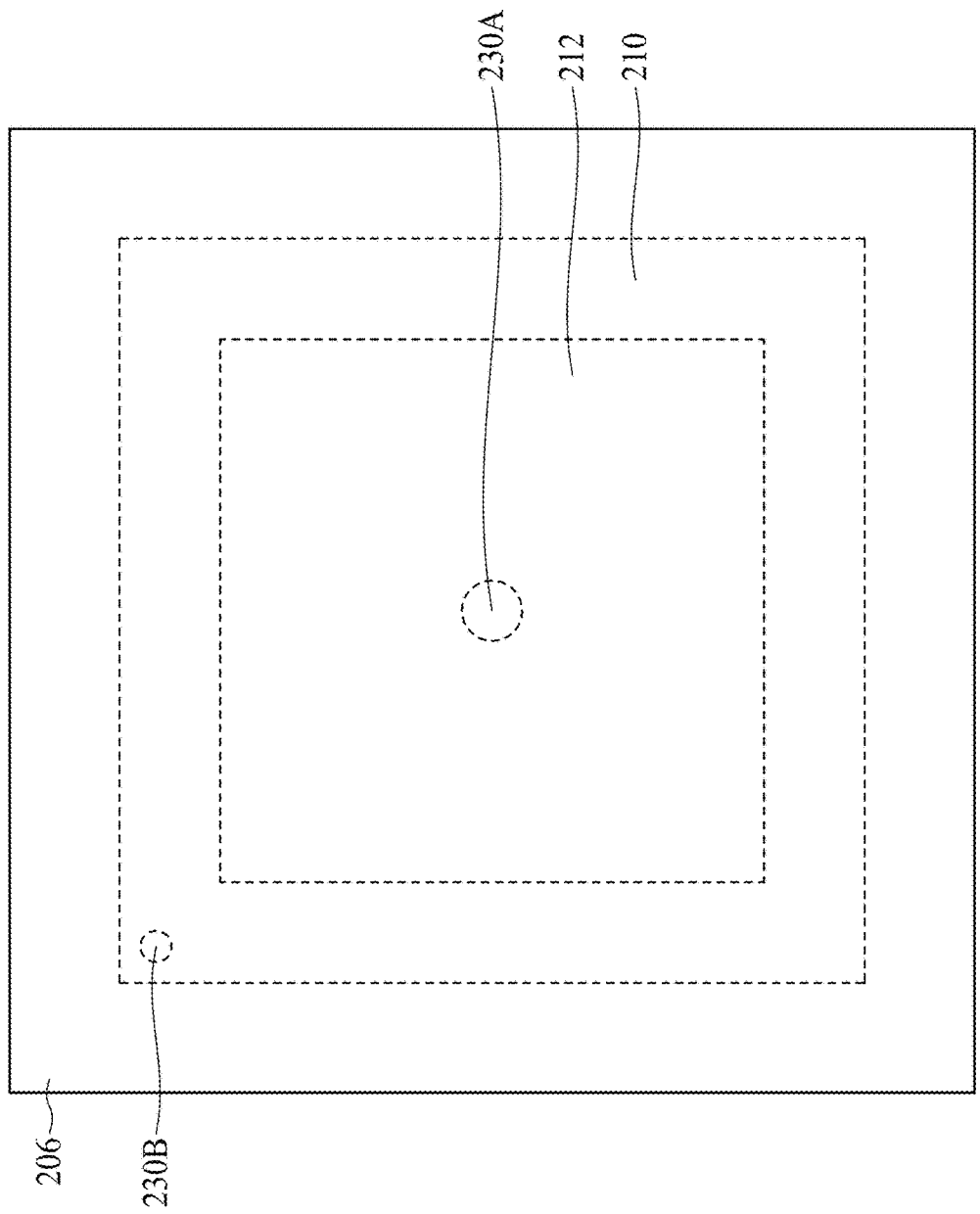
FIG. 18 is a top view of the package structure in FIG. 17, in accordance with some embodiments of the present disclosure.

FIG. 18 is a top perspective view of the package structure P26 in FIG. 17, in accordance with some embodiments of the present disclosure. The first metal component 230A is disposed between the second device 212 and the lid 206 and the second metal component 230B is disposed between the first device 210 and the lid 206. The first, second devices 210, 212 and the first and the second metal components 230A, 230B are obscured below the lid 206 in the top view. In some embodiments, the first metal component 230A and the second metal component 230B can be located on any portion of the device 110. In some embodiments, the first metal component 230A is disposed on a central portion of the second device 212 and the second metal component 230B is disposed on a peripheral portion of the first device 210. In some embodiments, top cross sections of the first metal component 230A and the second metal component 230B respectively can be various shapes such as circle, triangle, rectangle, square or the like.

Figure 19:
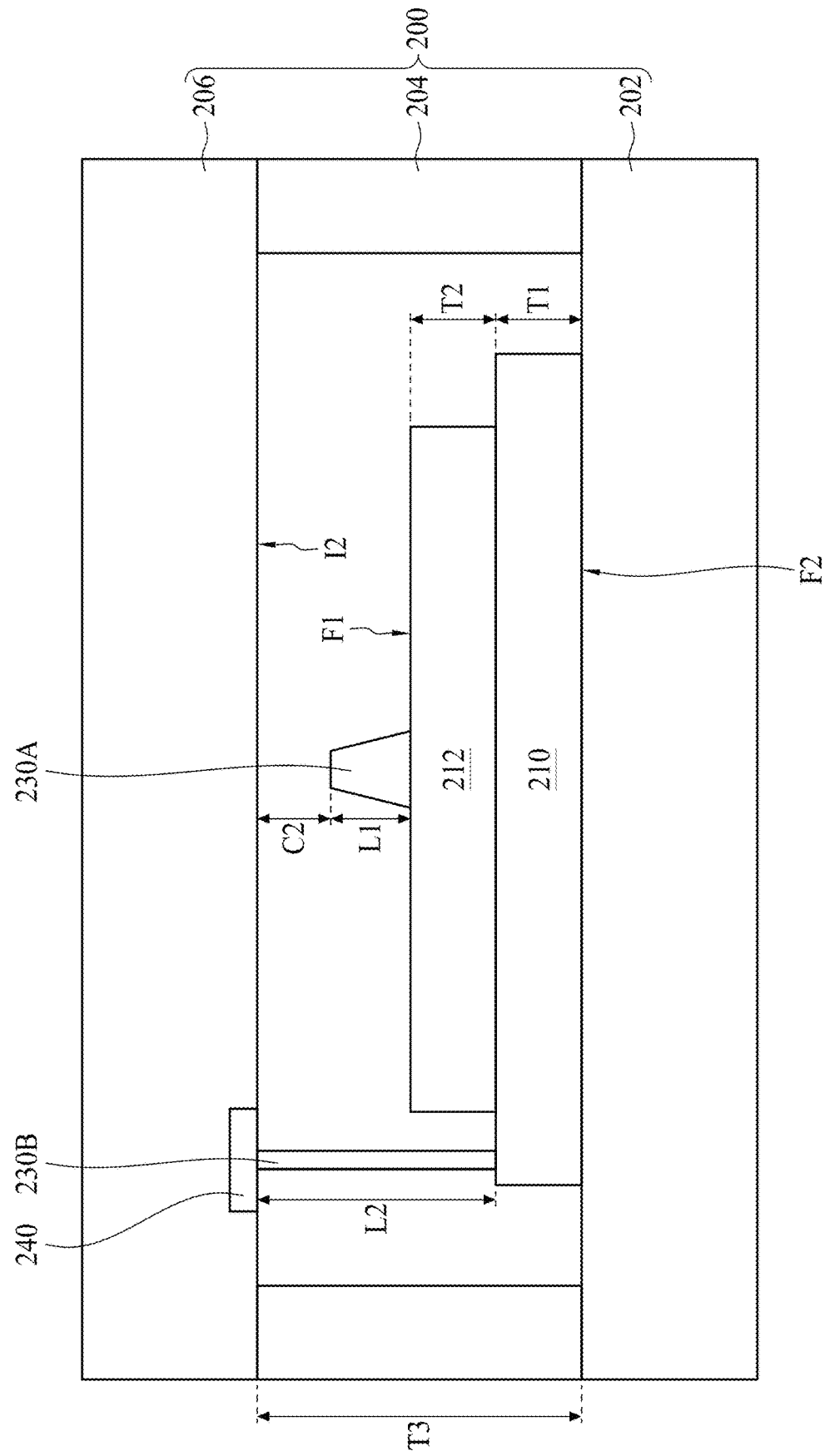
FIGS. 19 to 24 are schematic cross-sectional side views showing different package structures, in accordance with various embodiments of the present disclosure.

FIG. 19 is a schematic cross-sectional side view showing a package structure P27, in accordance with some embodiments of the present disclosure. The package structure P27 is similar to the package structure P26 in FIG. 17, except the package structure P27 further includes the first interconnect structure 240. In some embodiments, the second metal component 230B is disposed on the first interconnect structure 240 within the lid 206, while the first metal component 230A is disposed on the second device 212. In such embodiments, the second metal component 230B is pressed against the first device 210 and contacts both the first interconnect structure 240 and the first device 210.

Figure 20:
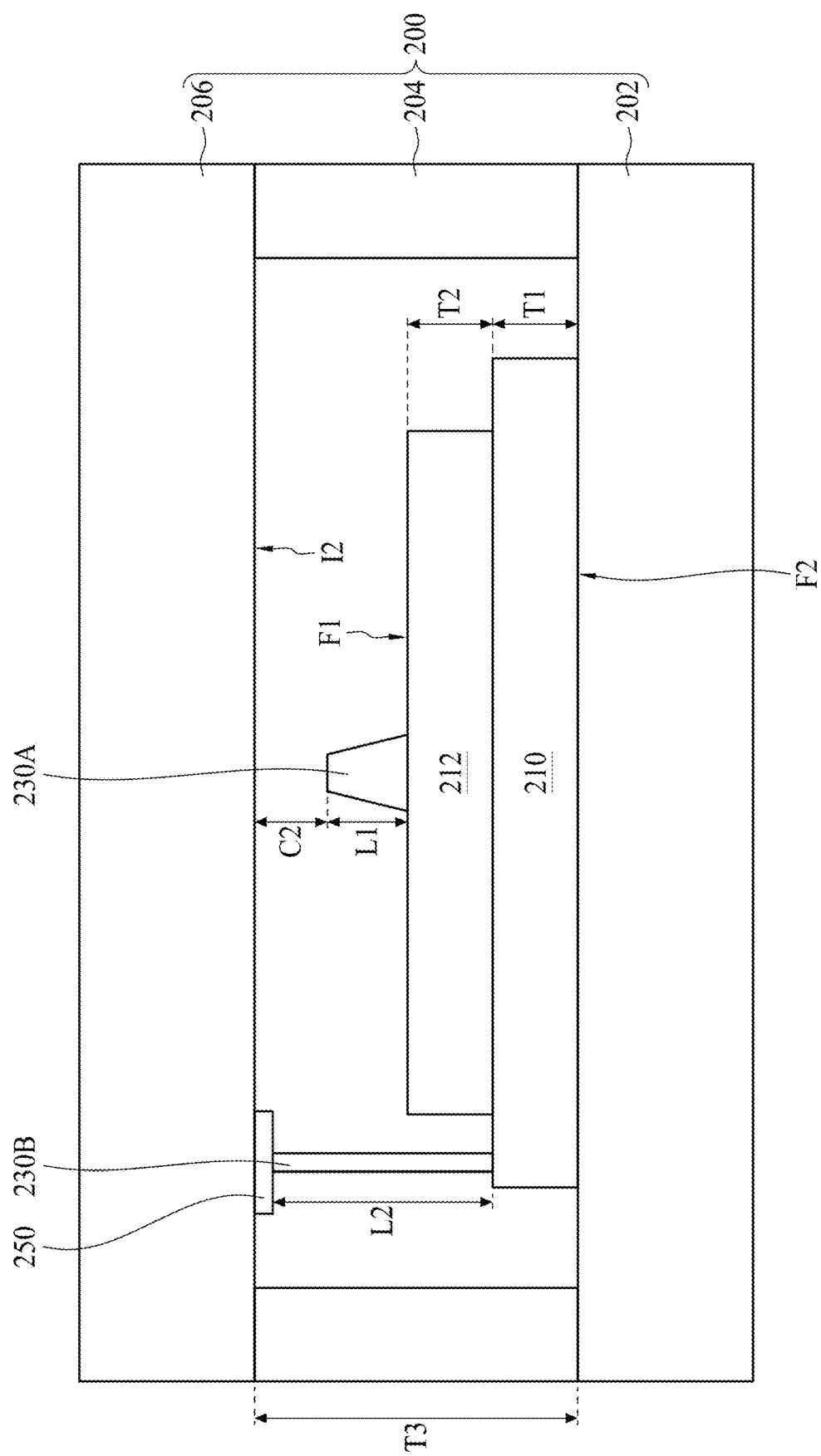

FIG. 20 is a schematic cross-sectional side view showing a package structure P28, in accordance with some embodiments of the present disclosure. The package structure P28 is similar to the package structure P26 in FIG. 17, except the package structure P28 further includes the second interconnect structure 250. In some embodiments, the second metal component 230B is disposed on the second interconnect structure 250 on the lid 206, while the first metal component 230A is disposed on the second device 212. In such embodiments, the second metal component 230B is pressed against the first device 210 and contacts both the second interconnect structure 250 and the first device 210. In some embodiments, a total of the thickness E2 and the second height L2 is equal to a total of the gap width C2, the first height L1 and the second thickness T2. In such embodiments, the gap width C2 is substantially equals to the total of the thickness E2 and the second height L2 subtracting the first height L1 and the second thickness T2, i.e., C2=E2+L2−L1−T2.

Figure 21:
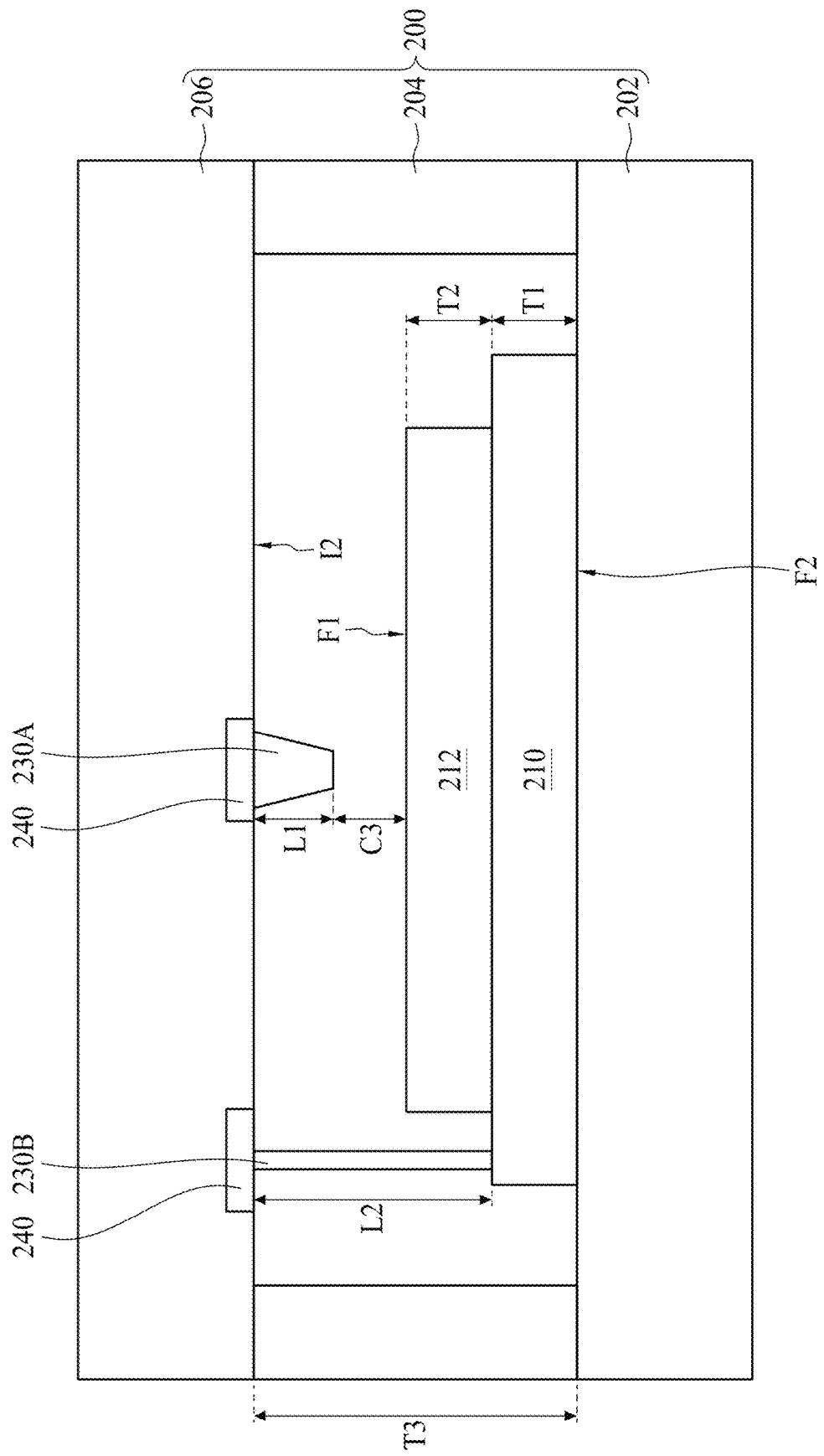

FIG. 21 is a schematic cross-sectional side view showing a package structure P29, in accordance with some embodiments of the present disclosure. The package structure P29 is similar to the package structure P27 in FIG. 19, except the package structure P29 includes multiple first interconnect structures 240 embedded in the lid 206. In some embodiments, the first metal component 230A and the second metal component 230B are respectively disposed on one of the first interconnect structures 240 within the lid 206. In such embodiments, the first metal component 230A attached to the lid 206 does not contact the second device 212. In some embodiments, a distance between a top surface of the first metal component 230A and the top surface F1 of the second device 212 is defined as a gap width C3. In some embodiments, the second height L2 is equal to a total of the gap width C3 and the first height L1. In such embodiments, the gap width C3 is substantially equals to a difference between the second height L2 and the first height L1, i.e., C3=L2−L1.

Figure 22:
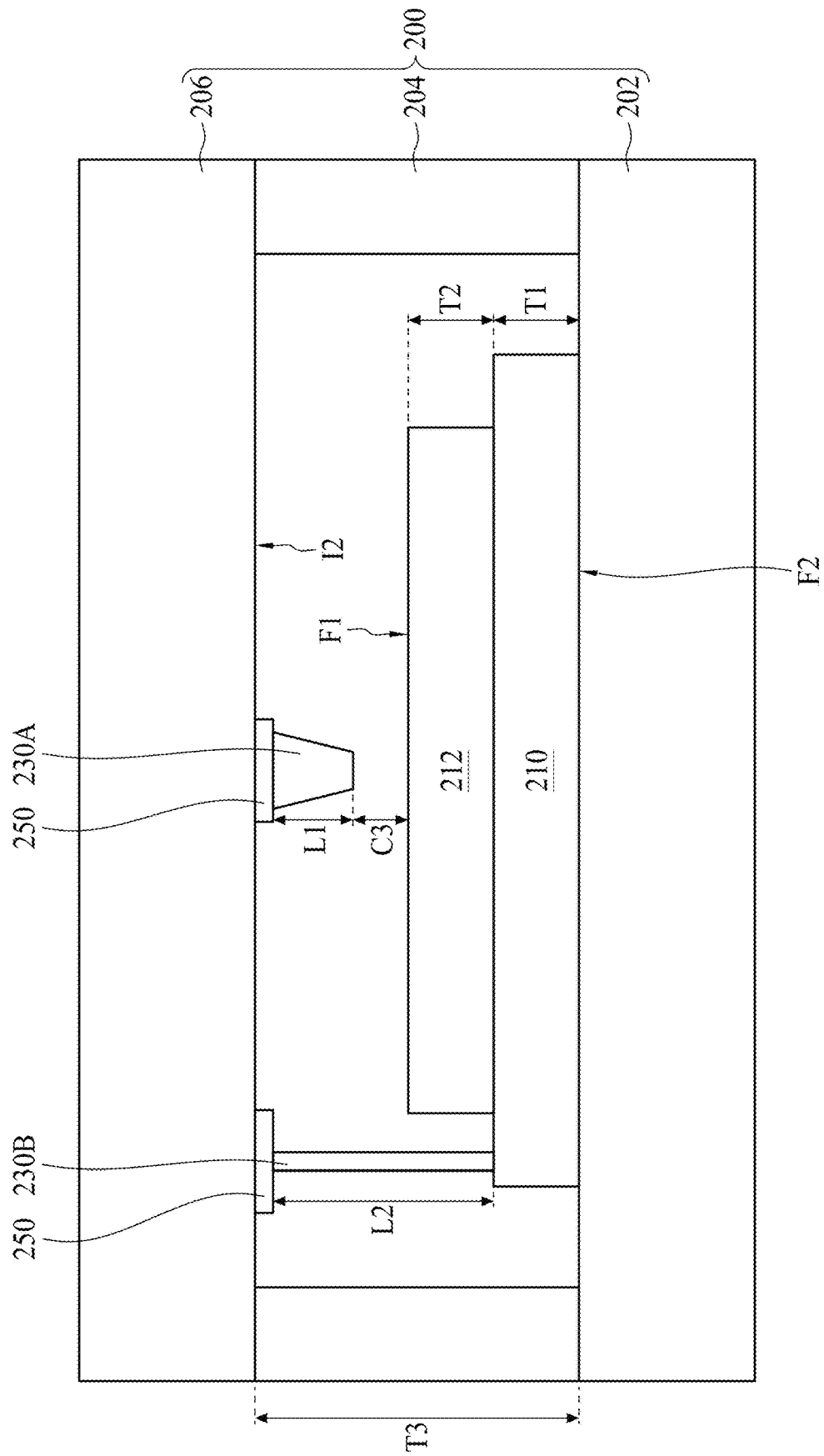

FIG. 22 is a schematic cross-sectional side view showing a package structure P30, in accordance with some embodiments of the present disclosure. The package structure P30 is similar to the package structure P28 in FIG. 20, except the package structure P30 includes multiple second interconnect structures 250 mounted on the interior surface I2 of the lid 206. In some embodiments, the first metal component 230A and the second metal component 230B are respectively disposed on one of the second interconnect structures 250 on the lid 206. In such embodiments, the first metal component 230A attached to the lid 206 does not contact the second device 212. In some embodiments, the gap width C3 is substantially equals to a difference between the second height L2 and the first height L1, i.e., C3=L2−L1.

Figure 23:
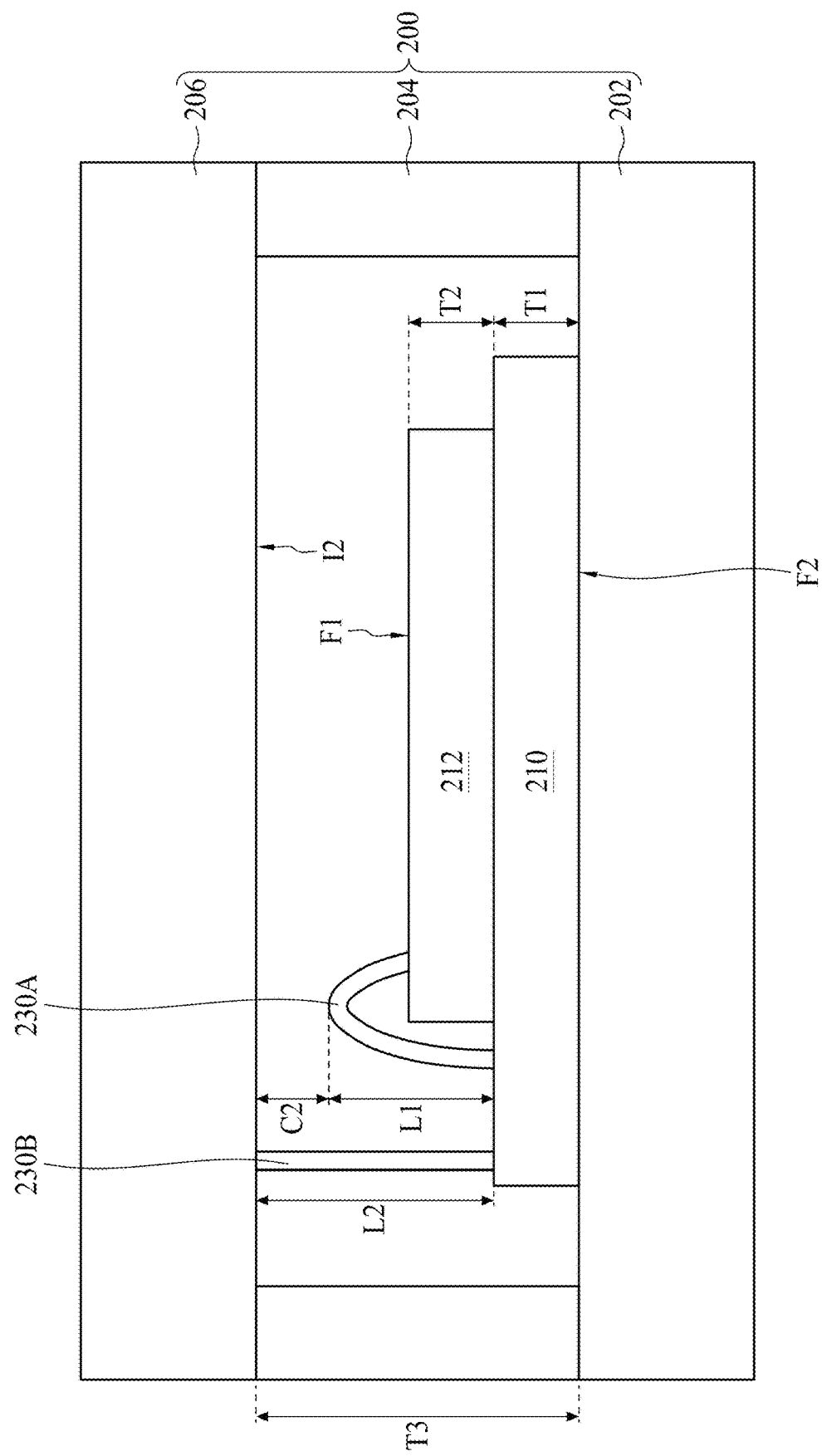

FIG. 23 is a schematic cross-sectional side view showing a package structure P31, in accordance with some embodiments of the present disclosure. The package structure P31 is similar to the package structure P26 in FIG. 17, except the first metal component 230A in the package structure P31 is a wire that connects the first device 210 and the second device 212. In some embodiments, one end of the first metal component 230A is disposed on the first device 210 and the other end of the first metal component 230A is disposed on the second device 212. In some embodiments, the first metal component 230A is U-shaped. In such embodiments, the first height L1 refers to a distance between the topmost portion and the bottommost portion of the first metal component 230A. In some embodiments, a distance between a top surface of the first metal component 230A and the interior surface I2 of the lid 206 facing the second device 212 is defined as a gap width C2. In some embodiments, the first metal component 230A is spaced from the lid 206 by the gap width C2. In some embodiments, the second height L2 is equal to a total of the gap width C2 and the first height L1. In such embodiments, the gap width C2 is substantially equals to the second height L2 subtracting the first height L1, i.e., C2=L2−L1.

Figure 24:
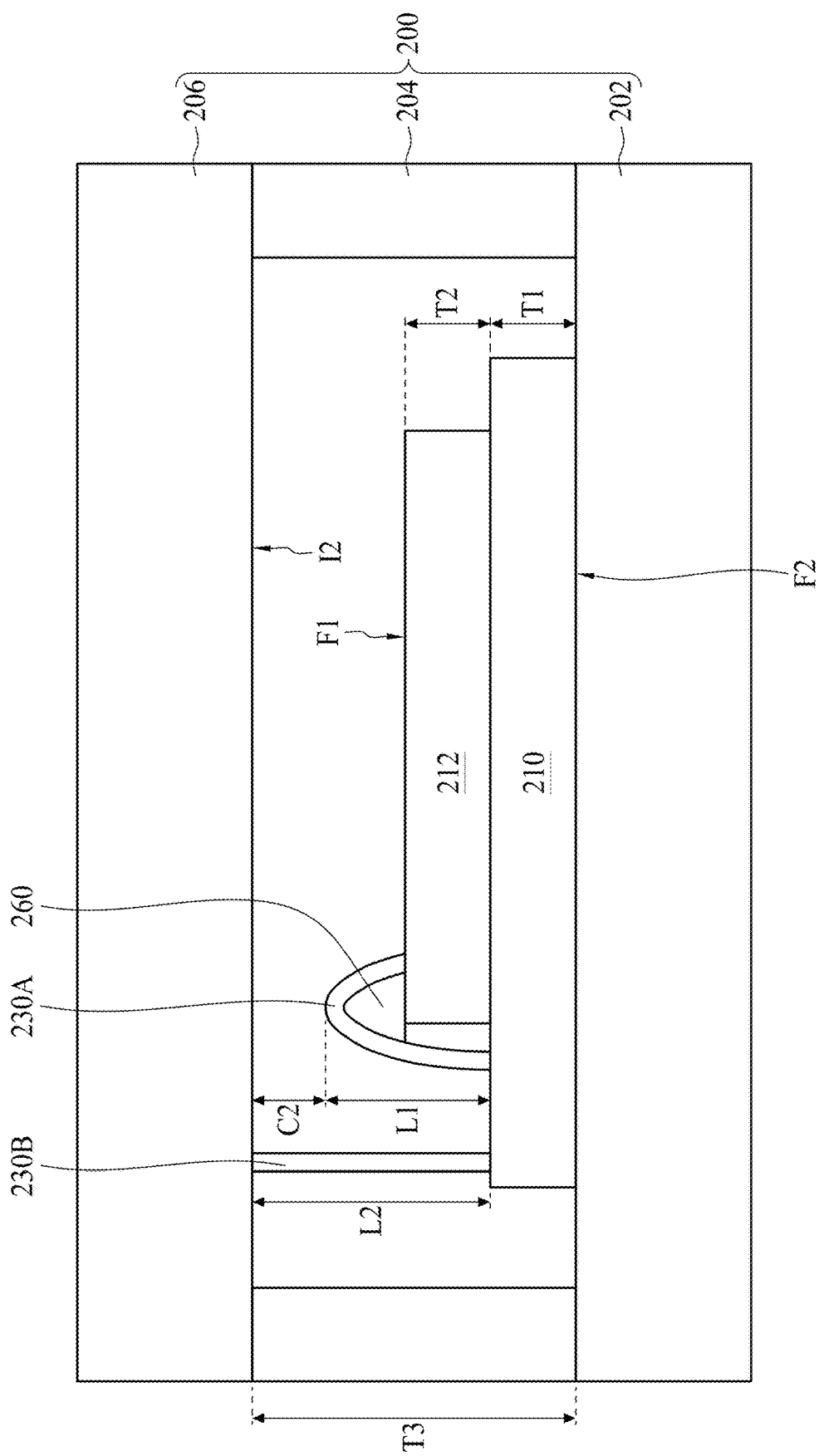

FIG. 24 is a schematic cross-sectional side view showing a package structure P32, in accordance with some embodiments of the present disclosure. The package structure P32 is similar to the package structure P31 in FIG. 23, except a filling material 260 is disposed on the first metal component 230A. In some embodiments, the filling material 260 can be made of the same material as the filling material 160. In some embodiments, the filling material 260 is disposed between the first metal component 230A and the second device 212. In other embodiments, the filling material 260 can be disposed between the first metal component 230A and the first device 210. In some embodiments, the filling material 260 can strengthen the attachment of the first metal component 230A to the first device 210 or the second device 212.

Figure 25:
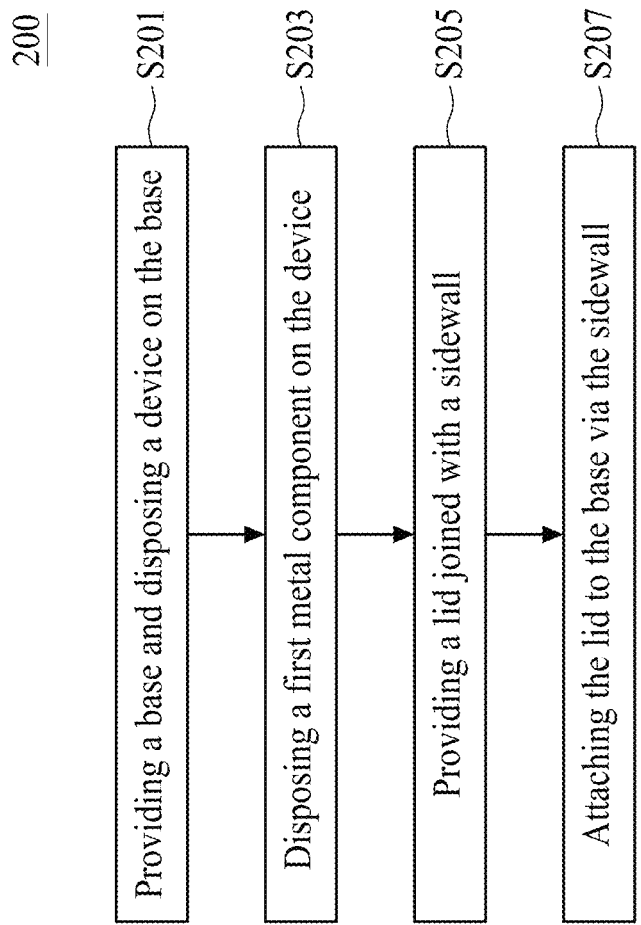
FIG. 25 is a flow diagram illustrating a method of manufacturing the package structure in FIG. 1, in accordance with various embodiments of the present disclosure.

FIG. 25 is a flow diagram illustrating a method 200 of manufacturing a package structure, in accordance with some embodiments of the present disclosure. FIGS. 26A to 26D are schematic cross-sectional side views illustrating sequential fabrication stages of the package structure P10 in FIG. 1, in accordance with some embodiments of the present disclosure.

Figure 26C:
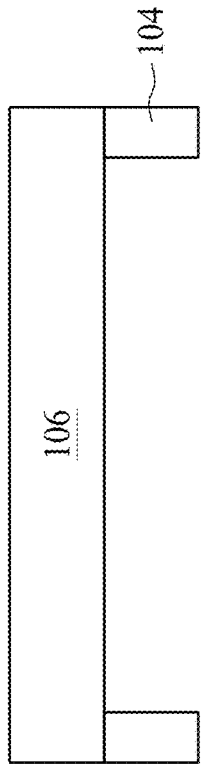
FIGS. 26A to 26D are schematic cross-sectional side views illustrating sequential fabrication stages of the package structure in FIG. 1, in accordance with some embodiments of the present disclosure.
Figure 26D:
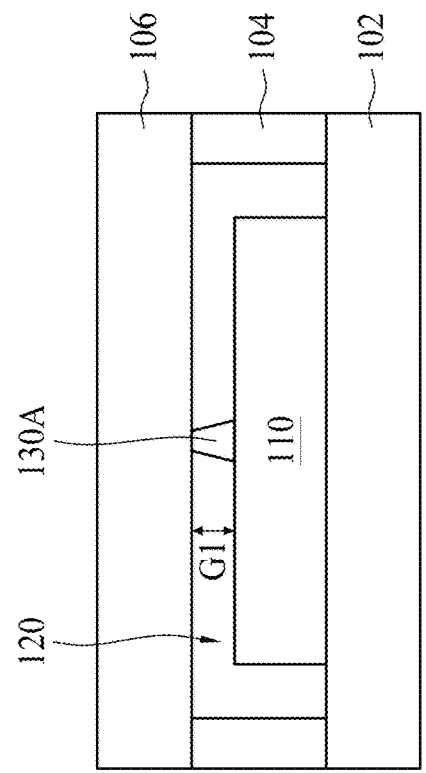
Figure 26A:
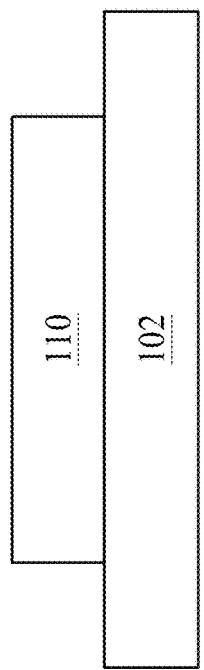

In operation S201, a base 102 is provided and a device 110 is disposed on the base 102 as shown in FIG. 26A. In some embodiments, the base 102 is made of, but not limited to, epoxy resin or ceramics. In some embodiments, the device 110 includes active components or passive components, for example but not limited to, CMOS, MEMS, stacks of CMOS and MEMS, resistors, capacitors, inductors, image sensors, motion sensors, microphones, speakers, motion stabilizers and the like.

Figure 26B:
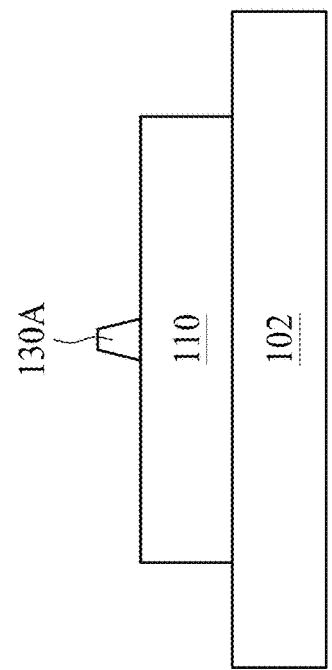

In operation S203, a first metal component 130A is disposed on the device 110 as shown in FIG. 26B. In some embodiments, the method of disposing the first metal component 130A on the device 110 includes but not limited to wire bonding. In some embodiments, the first metal component 130A is disposed by placing a stud on the device 110, elongating a wire from the stud, bonding the wire to the device 110, and cutting the wire to remove the wire from the stud. As a result, the stud is left on the device 110. In some embodiments, the first metal component 130A can have any suitable configuration. For example, the first metal component 130A can be a wire, a stud, a rod, a bump, a stack of studs or a stack of bumps. In some embodiments, the first metal component 130A can be located on any portion of the device 110. In some embodiments, the first metal component 130A is disposed on a central portion of the device 110.

In operation S205, a lid 106 joined with a sidewall 104 is provided as shown in FIG. 26C. In some embodiments, the lid 106 and the sidewall 104 are separable and a sealant (not shown) is disposed at junctions between the lid 106 and the sidewall 104. In some embodiments, the lid 106 and the sidewall 104 are made of the same material as the base 102.

In operation S207, the lid 106 is attached to the base 102 via the sidewall 104 as shown in FIG. 26D. In some embodiments, a sealant is disposed at junctions between the sidewall 104 and the base 102 and the lid 106 is joined with the base 102. In some embodiments, the lid 106 is disposed over the base 102, the device 110 and the first metal component 130A. In some embodiments, the lid 106 contacts the first metal component 130A disposed on the device 110. As a result, the package structure P10 in FIG. 1 is generally formed. In some embodiments, the height of the sidewall 104 is substantially greater than the thickness of the device 110 such that the lid 106 is spaced from the device 110 by a gap 120. In some embodiments, when first metal member 130A is used, direct control of the gap 120 is achieved based on the tolerance of first metal member 130A. In some embodiments, a distance between a top surface of the device 110 and an interior surface of the lid 106 facing the device 110 is defined as a gap width G1. In some embodiments, the gap width G1 is derived based on a height of the first metal component 130A. In some embodiments, the disposing of the lid 106 controls a magnitude of the gap width G1.

Figure 27:
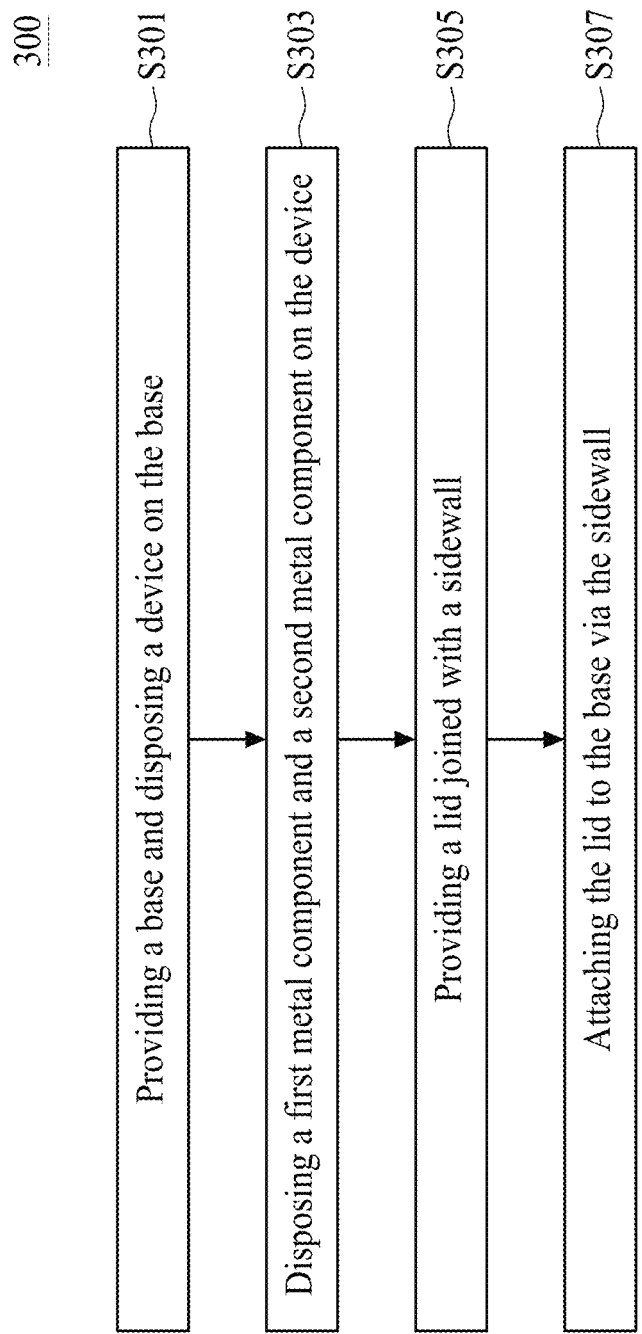
FIG. 27 is a flow diagram illustrating a method of manufacturing the package structure in FIG. 4, in accordance with various embodiments of the present disclosure.

FIG. 27 is a flow diagram illustrating a method 300 of manufacturing a package structure, in accordance with some embodiments of the present disclosure. FIGS. 28A to 28D are schematic cross-sectional side views illustrating sequential fabrication stages of the package structure P13 in FIG. 4, in accordance with some embodiments of the present disclosure.

Figure 28C:
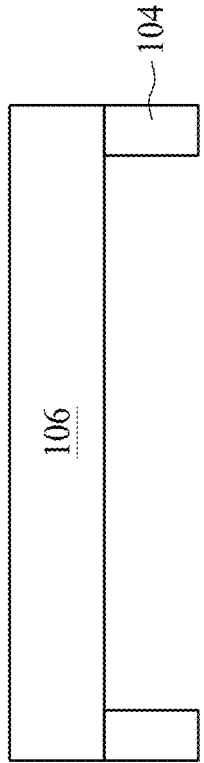
FIGS. 28A to 28D are schematic cross-sectional side views illustrating sequential fabrication stages of the package structure in FIG. 4, in accordance with some embodiments of the present disclosure.
Figure 28D:
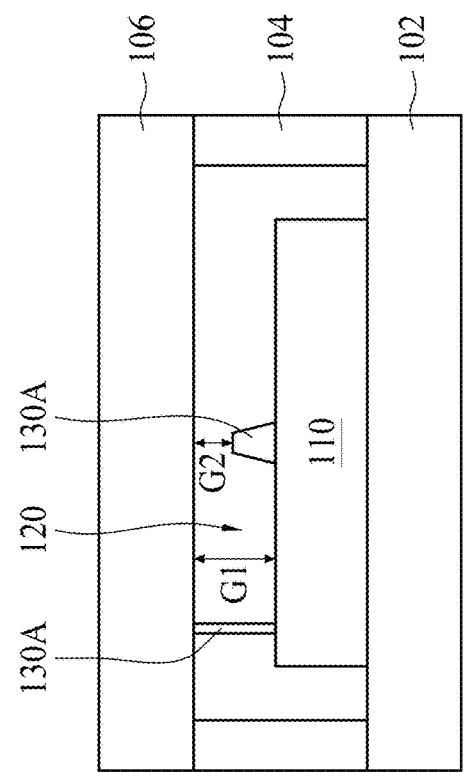
Figure 28A:
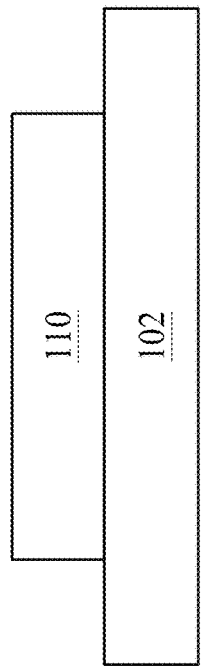

In operation S301, a base 102 is provided and a device 110 is disposed on the base 102 as shown in FIG. 28A.

Figure 28B:
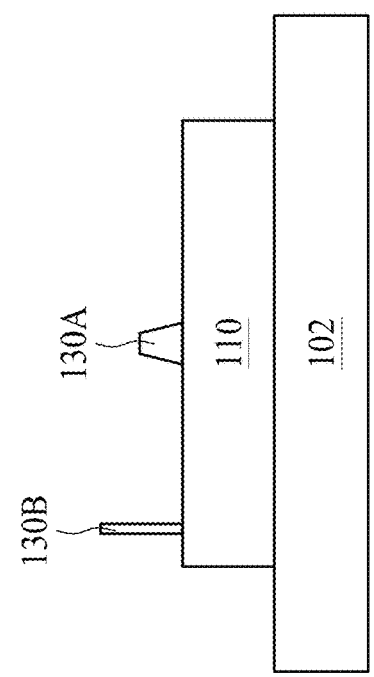

In operation S303, a first metal component 130A and a second metal component 130B are disposed on the device 110 as shown in FIG. 28B. In some embodiments, the method of disposing the first metal component 130A and the second metal component 130B on the device 110 includes but not limited to wire bonding. In some embodiments, the first metal component 130A is disposed by placing a stud on the device 110, elongating a wire from the stud, bonding the wire to the device 110, and cutting the wire to remove the wire from the stud. As a result, the stud is left on the device 110. In some embodiments, the second metal component 130B is disposed by landing a bonding pad on the device 110 and attaching a wire vertically to the device 110 through the bonding pad. In some embodiments, the first metal component 130A and the second metal component 130B can have any suitable configuration as long as the height of the second metal component 130B is substantially greater than the height of the first metal component 130A. For example, the first metal component 130A can be a stud, a rod or a bump and the second metal component 130B can be a wire, a stack of studs or a stack of bumps. In some embodiments, the first and the second metal components 130A, 130B can be located on any portion of the device 110. In some embodiments, the first metal component 130A is disposed on a central portion of the device 110 and the second metal component 130B is disposed on a peripheral portion of the device 110.

In operation S305, a lid 106 joined with a sidewall 104 is provided as shown in FIG. 28C.

In operation S307, the lid 106 is attached to the base 102 via the sidewall 104 as shown in FIG. 28D. In some embodiments, the lid 106 is disposed over the base 102, the device 110, the first metal component 130A and the second metal component 130B. In some embodiments, the lid 106 contacts the second metal component 130B but does not contact the first metal component 130A. As a result, the package structure P13 in FIG. 4 is formed. In some embodiments, the lid 106 is spaced from the device 110 by a gap 120. In some embodiments, when second metal member 130B is used, direct control of the gap 120 is achieved based on the tolerance of second metal member 130B. In some embodiments, a distance between a top surface of the device 110 and an interior surface of the lid 106 facing the device 110 is defined as a gap width G1. In some embodiments, the gap width G1 is derived based on a height of the second metal component 130B. In some embodiments, a distance between a top surface of the first metal component 130A and the interior surface of the lid 106 facing the device 110 is defined as a gap width G2. In some embodiments, the height of the second metal member 130B is equal to a total of the gap width G2 and the height of the first metal member 130A. In such embodiments, the gap width G2 is substantially equals to a difference between the heights of the first metal member 130A and the second metal member 130B.

Figure 29:
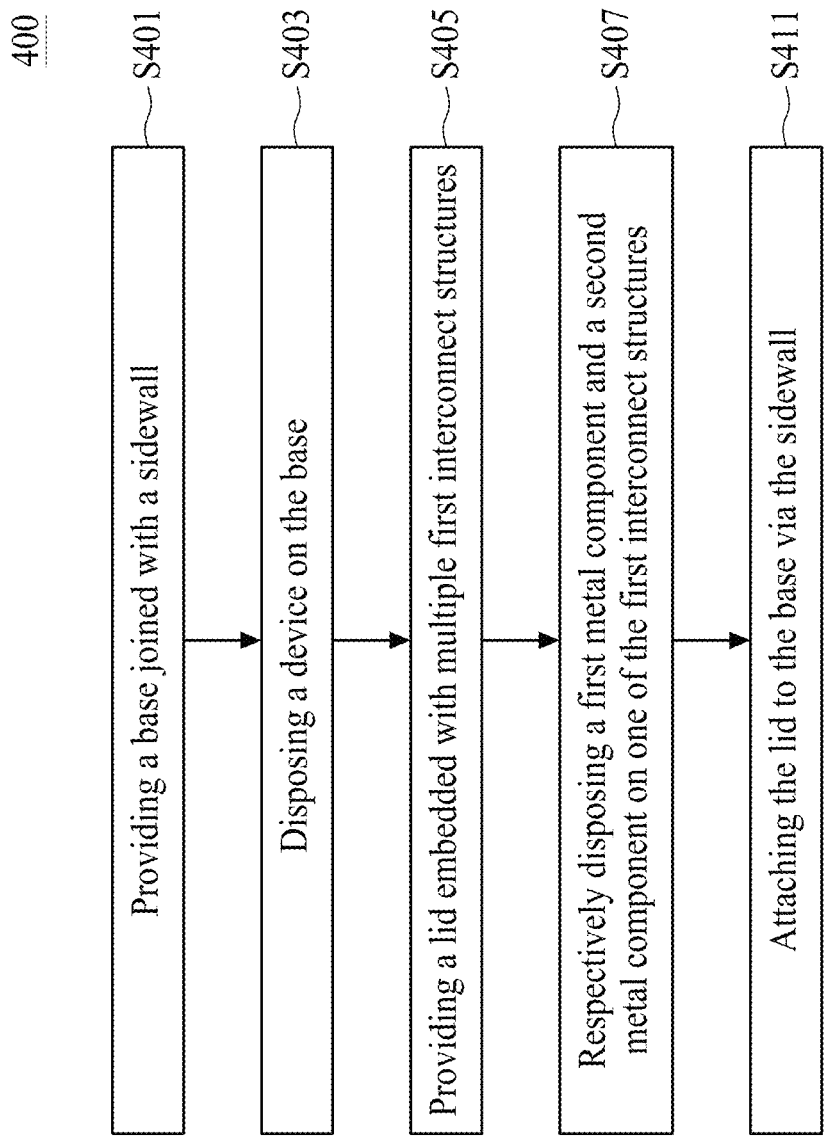
FIG. 29 is a flow diagram illustrating a method of manufacturing the package structure in FIG. 8, in accordance with various embodiments of the present disclosure.

FIG. 29 is a flow diagram illustrating a method 400 of manufacturing a package structure, in accordance with some embodiments of the present disclosure. FIGS. 30A to 30E are schematic cross-sectional side views illustrating sequential fabrication stages of the package structure P16 in FIG. 8, in accordance with some embodiments of the present disclosure.

Figure 30A:
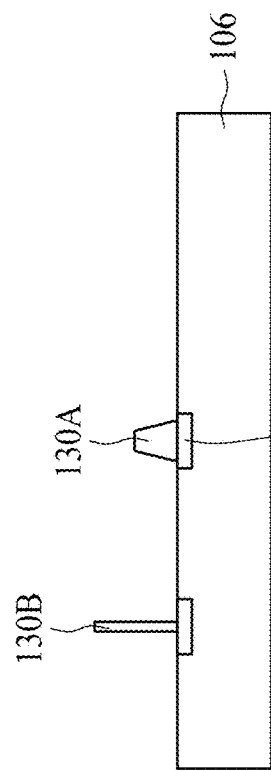
FIGS. 30A to 30E are schematic cross-sectional side views illustrating sequential fabrication stages of the package structure in FIG. 8, in accordance with some embodiments of the present disclosure.

In operation S401, a base 102 joined with a sidewall 104 is provided as shown in FIG. 30A. In some embodiments, the base 102 and the sidewall 104 are an integral structure. For example, a central portion of a molding material is removed by a drilling process such that only the base and the sidewall of the molding material are remained.

Figure 30B:
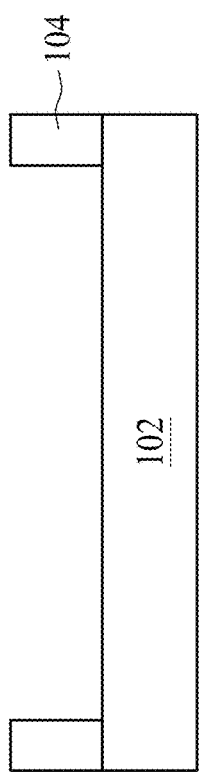

In operation S403, a device 110 is disposed on the base 102 as shown in FIG. 30B. In some embodiments, the device 110 is surrounded by the sidewall 104.

Figure 30C:
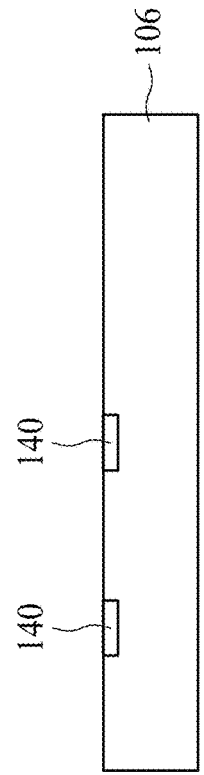

In operation S405, a lid 106 embedded with multiple first interconnect structures 140 is provided as shown in FIG. 30C. In some embodiments, the first interconnect structure 140 can be, for example, a lead frame. In some embodiments, surfaces of the first interconnect structures facing away the lid 106 are exposed using a polishing process or a grinding process such that the surfaces of the first interconnect structures are coplanar with a surface of the lid 106.

Figure 30D:
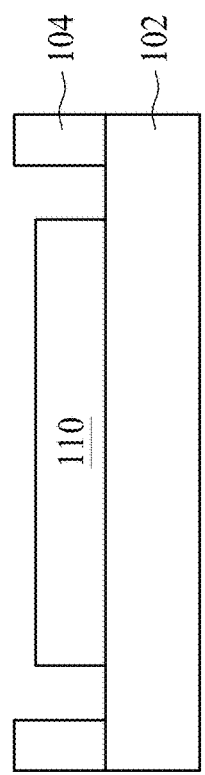

In operation S407, a first metal component 130A and a second metal component 130B are respectively disposed on one of the first interconnect structures 140 as shown in FIG. 30D. In some embodiments, the height of the second metal component 130B is substantially greater than the height of the first metal component 130A. In some embodiments, the second metal component 130B is in different configuration from the first metal component 130A. For example, the first metal component 130A is a stud while the second metal component 130B is a wire, as shown in FIG. 30D. In other embodiments, the second metal component 130B is in the same configuration as the first metal component 130A. For example, the first metal component 130A is a stud and the second metal component 130B is a stack of studs.

Figure 30E:
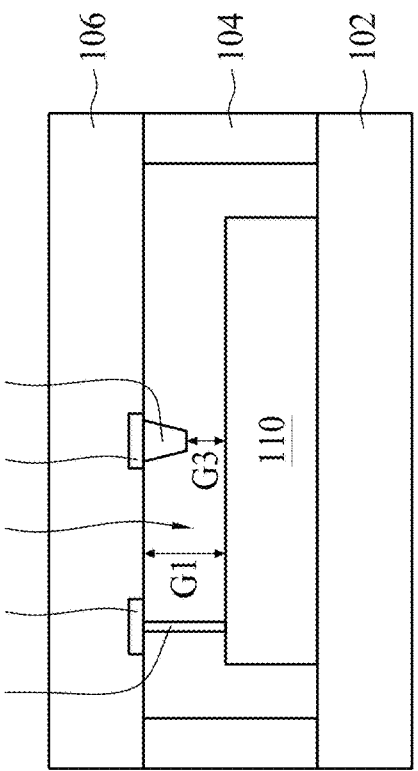

In operation S409, the lid 106 is attached to the base 102 via the sidewall 104 as shown in FIG. 30E. In some embodiments, a sealant is disposed at junctions between the sidewall 104 and the lid 106 and the lid 106 is joined with the base 102. In some embodiments, the attachment of the lid 106 is in a manner that the first metal component 130A and the second metal component 130B are confronted with the device 110. In some embodiments, the second metal component 130B disposed on the first interconnect structure 140 is pressed against the device 110 while the first metal component 130A disposed on the first interconnect structure 140 does not contact the device 110. As a result, the package structure P16 in FIG. 8 is formed. In some embodiments, the lid 106 is spaced from the device 110 by a gap 120. In some embodiments, when second metal member 130B is used, direct control of the gap 120 is achieved based on the tolerance of second metal member 130B. In some embodiments, a distance between a top surface of the device 110 and an interior surface of the lid 106 facing the device 110 is defined as a gap width G1. In some embodiments, the gap width G1 is derived based on a height of the second metal component 130B. In some embodiments, a distance between a top surface of the first metal component 130A and the top surface of the device 110 is defined as a gap width G3. In some embodiments, the height of the second metal member 130B is equal to a total of the gap width G3 and the height of the first metal member 130A. In such embodiments, the gap width G3 is substantially equals to a difference between the heights of the first metal member 130A and the second metal member 130B.

Figure 31:
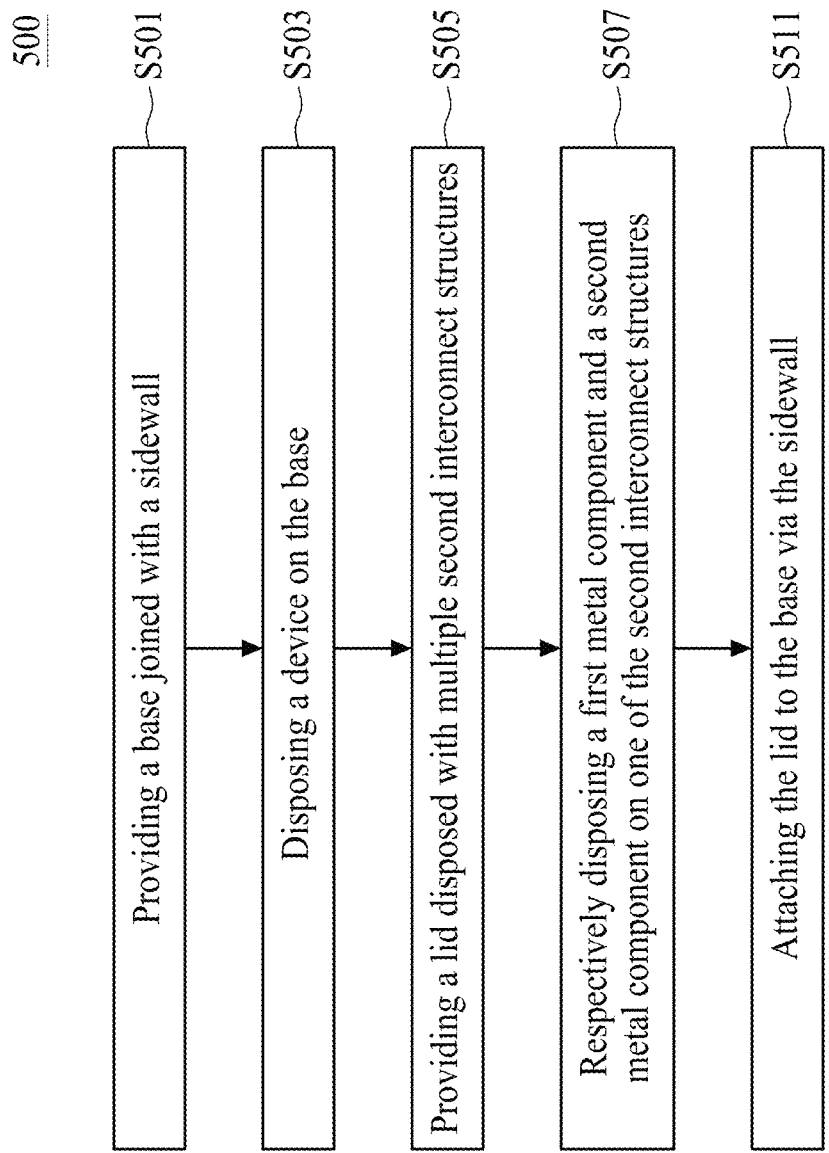
FIG. 31 is a flow diagram illustrating a method of manufacturing the package structure in FIG. 9, in accordance with various embodiments of the present disclosure.

FIG. 31 is a flow diagram illustrating a method 500 of manufacturing a package structure, in accordance with some embodiments of the present disclosure. FIGS. 32A to 32E are schematic cross-sectional views illustrating sequential fabrication stages of the package structure P17 in FIG. 9, in accordance with some embodiments of the present disclosure.

Figure 32A:
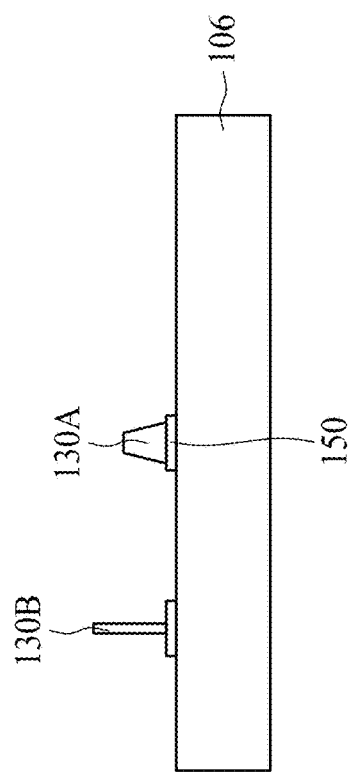
FIGS. 32A to 32E are schematic cross-sectional side views illustrating sequential fabrication stages of the package structure in FIG. 9, in accordance with some embodiments of the present disclosure.

In operation S501, a base 102 joined with a sidewall 104 is provided as shown in FIG. 32A.

Figure 32D:
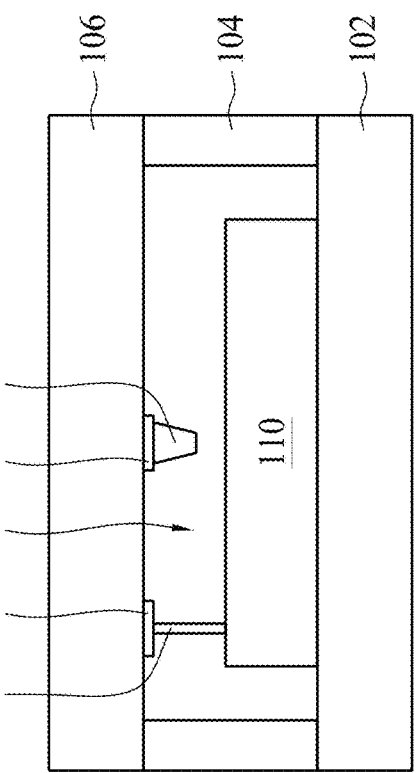
Figure 32B:
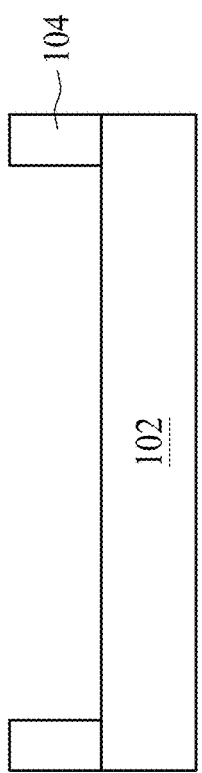

In operation S503, a device 110 is disposed on the base 102 as shown in FIG. 32B.

Figure 32C:
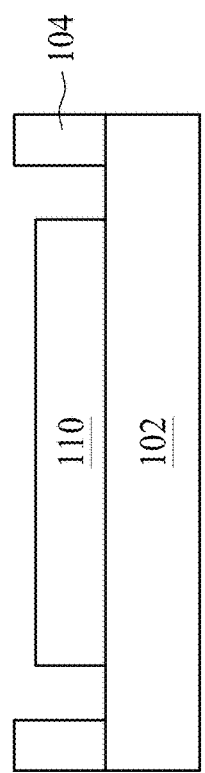

In operation S505, a lid 106 disposed with multiple second interconnect structures 150 is provided as shown in FIG. 32C. In some embodiments, the second interconnect structure 150 can be, for example, a pin or an electrode. In some embodiments, the formation of the second interconnect structure 150 may at least include a deposition process, a lithographic process and an etching process.

In operation S507, a first metal component 130A and a second metal component 130B are respectively disposed on one of the second interconnect structures 150 as shown in FIG. 32D. In some embodiments, the height of the second metal component 130B is substantially greater than the height of the first metal component 130A.

Figure 32E:
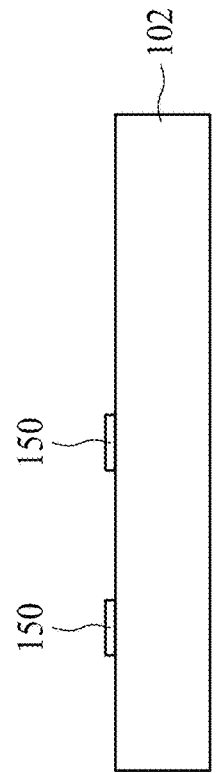

In operation S509, the lid 106 is attached to the base 102 via the sidewall 104 as shown in FIG. 32E. In some embodiments, the attachment of the lid 106 is in a manner that the first metal component 130A and the second metal component 130B are confronted with the device 110. In some embodiments, the second metal component 130B disposed on the second interconnect structure 150 is pressed against the device 110 while the first metal component 130A disposed on the second interconnect structure 150 does not contact the device 110. As a result, the package structure P17 in FIG. 9 is generally formed. In some embodiments, the lid 106 is spaced from the device 110 by a gap 120.

The present disclosure is directed to various package structures with metal components disposed therein and manufacturing methods of the package structures. In a package structure, the standard deviation or tolerance of a dimension such as height or thickness of a molding material is generally very large, for example, greater than 50 μm. When a certain parameter (e.g., a device-to-lid gap width) inside the package structure needs be sufficiently precise, it is difficult to precisely control and obtain the parameter because the build-up standard deviations or tolerances of dimensions of the molding material is generally inevitable. The present disclosure provides various package structures that enable control of the gap width inside the package structures. The gap between a top surface of the device and an interior surface of the lid facing the device is controlled by incorporating one or more metal members such as studs or bumps between the device and the lid. Because the standard deviation of a height of a stud or bump is significantly less than that of the molding material, the variation of the gap width can be reduced when the gap width is directly referenced to the height of the metal member. At such time, tolerances related to dimensions of the molding material and the device do not have to be considered and the accumulation of statistical tolerances can be decreased. Therefore, the device-to-lid gap can be controlled by the metal member and the gap width can be determined by the height of the metal member with much greater precision. In addition, the metal members can not only be employed for a hermetic package structure but also a package structure having an opening that partially exposes the device therein.

One aspect of the present disclosure provides a package structure. The package structure includes a base, a device disposed on the base, a lid disposed over the base and the device and spaced apart from the device, and a first metal component disposed between the device and the lid, wherein the first metal component contacts the device and the lid.

In some embodiments, a distance between a top surface of the device and an interior surface of the lid facing the top surface of the device is between about 5 um and about 500 um.

In some embodiments, the first metal component is a wire, a stud, a rod, a bump, a stack of studs or a stack of bumps.

In some embodiments, the package structure further includes a second metal component disposed between the device and the lid.

In some embodiments, the first metal component is in same or different configuration from the second metal component.

In some embodiments, a height of the second metal component is different from a height of the first metal component.

In some embodiments, the first metal component and the second metal component are disposed on the device.

In some embodiments, the second metal component is separated from the lid.

In some embodiments, the first metal component and the second metal component are disposed on an interconnect structure on or within the lid.

In some embodiments, the second metal component is separated from the device.

In some embodiments, the package structure further includes a filling material surrounding the first metal component or the second metal component.

Another aspect of the present disclosure provides a package structure. The package structure includes a base, a first device disposed on the base, a second device disposed on the first device, a lid disposed over the base and spaced apart from the first device and the second device and a first metal component disposed between the first device and the lid, wherein the first metal component contacts the lid.

In some embodiments, the first metal component is disposed on the first device.

In some embodiments, the first metal component is disposed on the second device.

In some embodiments, the package structure further includes a second metal component disposed between the second device and the lid.

In some embodiments, the second metal component is disposed on the second device and separated from the lid.

In some embodiments, the second metal component is disposed on the lid and separated from the second device.

In some embodiments, a width of the first device is substantially greater than a width of the second device.

Another aspect of the present disclosure provides a method. The method includes providing a base and a device disposed on the base; disposing a first metal component on the device; disposing a lid over the base and the device to contact the first metal component; and deriving the distance based on a first height of the first metal component.

In some embodiments, the disposing of the lid includes controlling the distance between a top surface of the device and an interior surface facing the top surface of the device.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods and steps.

The invention claimed is:

1. A package structure, comprising:
a molding member;
a device inside the molding member and spaced apart from an interior surface of the molding member over the device;
a first metal component disposed on a top surface of the device and having a top surface opposite to the interior surface of the molding member; and
a second metal component disposed on the top surface of the device, wherein the second metal component contacts the interior surface and the top surface,
wherein an entirety of the top surface of the first metal component is exposed and separated from the interior surface.

2. The package structure according to claim 1, wherein a distance between the top surface of the device and the interior surface of the molding member facing the top surface of the device is between about 5 um and about 500 um.

3. The package structure according to claim 1, wherein the first metal component is a wire, a stud, a rod, a bump, a stack of studs or a stack of bumps.

4. The package structure according to claim 1, wherein the second metal component is a wire, a stud, a rod, a bump, a stack of studs or a stack of bumps.

5. The package structure according to claim 4, wherein the second metal component is in same or different configuration from the first metal component.

6. The package structure according to claim 4, wherein a height of the second metal component is different from a height of the first metal component.

7. The package structure according to claim 4, wherein the first metal component and the second metal component are in contact with the device.

8. The package structure according to claim 1, wherein the molding member includes a base, a sidewall and a lid, the device is disposed on the base and surrounded by the sidewall.

9. The package structure according to claim 4, wherein the first metal component and the second metal component are disposed on an interconnect structure.

10. The package structure according to claim 9, wherein the second metal component is separated from the device.

11. The package structure according to claim 4, further comprising a filling material surrounding the first metal component or the second metal component.

12. A package structure, comprising:
a base;
a first device disposed on the base;
a second device disposed on the first device;
a lid disposed over the second device, and spaced apart from the first device and the second device;
a first metal component disposed between the first device and the lid; and
a second metal component disposed on the second device and separated from the lid, wherein the first metal component has a height substantially greater than a thickness of the second device.

13. The package structure according to claim 12, wherein the first metal component vertically extends between the first device and the lid.

14. The package structure according to claim 12, wherein the first metal component is disposed on the second device.

15. The package structure according to claim 12, wherein the second metal component is disposed between the second device and the lid.

16. The package structure according to claim 15, wherein the second metal component is disposed on the second device and separated from the lid.

17. The package structure according to claim 15, wherein the second metal component is disposed on the lid and separated from the second device.

18. The package structure according to claim 12, wherein a thickness of the first device is substantially greater than the thickness of the second device.

19. A method of forming a package structure, comprising:
providing a base and a device disposed on the base;
disposing a first metal component over the device;
disposing a second metal component over the device and adjacent to the first metal component;
disposing a lid over the base and the device to contact the second metal component, wherein the second metal component contacts an interior surface of the lid and a top surface of the device, wherein an entire top surface of the first metal component is exposed, and the entire top surface of the first metal component is opposite to and separated from the interior surface of the lid; and
deriving a distance based on a first height of the second metal component, wherein the first metal component tapers from the top surface towards the interior surface, or tapers from the interior surface towards the top surface.

20. The method according to claim 19, wherein the disposing of the lid includes controlling the distance between the top surface and the interior surface facing the top surface.

* * * * *